(12) United States Patent
Lin et al.

(10) Patent No.: US 8,970,035 B2
(45) Date of Patent: Mar. 3, 2015

(54) BUMP STRUCTURES FOR SEMICONDUCTOR PACKAGE

(71) Applicants: Jing-Cheng Lin, Hsin-Chu (TW); Po-Hao Tsai, Zhongli (TW)

(72) Inventors: Jing-Cheng Lin, Hsin-Chu (TW); Po-Hao Tsai, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 28 days.

(21) Appl. No.: 13/624,356

(22) Filed: Sep. 21, 2012

(65) Prior Publication Data

US 2014/0061897 A1    Mar. 6, 2014

Related U.S. Application Data

(60) Provisional application No. 61/695,560, filed on Aug. 31, 2012.

(51) Int. Cl.
*H01L 23/48* (2006.01)
*H01L 23/52* (2006.01)

(52) U.S. Cl.
USPC ........ 257/737; 257/778; 257/779; 257/E23.21

(58) Field of Classification Search
CPC ............... H01L 2224/1403; H01L 2224/0603; H01L 2224/13023; H01L 2224/16227
USPC ........................... 257/737, 778, 779, E23.021
See application file for complete search history.

(56) References Cited

U.S. PATENT DOCUMENTS

| | | | |
|---|---|---|---|
| 4,545,610 A * | 10/1985 | Lakritz et al. ................. | 438/125 |
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,448,114 A * | 9/1995 | Kondoh et al. ................ | 257/778 |
| 5,481,133 A | 1/1996 | Hsu | |
| 5,633,535 A | 5/1997 | Chao et al. | |
| 5,796,169 A * | 8/1998 | Dockerty et al. ............. | 257/780 |
| 5,814,890 A * | 9/1998 | Iwasaki ......................... | 257/778 |
| 5,933,323 A | 8/1999 | Bhatia et al. | |
| 6,002,177 A | 12/1999 | Gaynes et al. | |
| 6,150,255 A | 11/2000 | Downes, Jr. et al. | |
| 6,172,874 B1 | 1/2001 | Bartilson | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |

(Continued)

FOREIGN PATENT DOCUMENTS

| | | |
|---|---|---|
| JP | 2011086879 | 4/2011 |
| KR | 20050032289 | 4/2005 |

(Continued)

*Primary Examiner* — Nitin Parekh
(74) *Attorney, Agent, or Firm* — Slater & Matsil, L.L.P.

(57) ABSTRACT

A package structure includes a first substrate bonded to a second substrate by Connecting metal pillars on the first substrate to connectors on the second substrate. A first metal pillar is formed overlying and electrically connected to a metal pad on a first region of the first substrate, and a second metal pillar is formed overlying a passivation layer in a second region of the first substrate. A first solder joint region is formed between metal pillar and the first connector, and a second solder joint region is formed between the second metal pillar and the second connector. The thickness of the first metal pillar is greater than the thickness of the second metal pillar.

14 Claims, 26 Drawing Sheets

(56) References Cited

U.S. PATENT DOCUMENTS

| | | |
|---|---|---|
| 6,271,059 B1 | 8/2001 | Bertin et al. |
| 6,279,815 B1 | 8/2001 | Correia et al. |
| 6,355,501 B1 | 3/2002 | Fung et al. |
| 6,366,462 B1 | 4/2002 | Chu et al. |
| 6,434,016 B2 | 8/2002 | Zeng et al. |
| 6,443,351 B1 | 9/2002 | Huang et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,611,057 B2 | 8/2003 | Mikubo et al. |
| 6,661,085 B2 | 12/2003 | Kellar et al. |
| 6,717,812 B1 | 4/2004 | Pinjala et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,015,572 B2 | 3/2006 | Yamaji |
| 7,037,804 B2 | 5/2006 | Kellar et al. |
| 7,056,807 B2 | 6/2006 | Kellar et al. |
| 7,057,270 B2 | 6/2006 | Moshayedi |
| 7,087,538 B2 | 8/2006 | Staines et al. |
| 7,151,009 B2 | 12/2006 | Kim et al. |
| 7,157,787 B2 | 1/2007 | Kim et al. |
| 7,180,165 B2 | 2/2007 | Ellsberry et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,362,580 B2 | 4/2008 | Hua et al. |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,611,923 B2 | 11/2009 | Fasano et al. |
| 7,834,450 B2 | 11/2010 | Kang |
| 8,021,921 B2 * | 9/2011 | Lin et al. .................... 438/108 |
| 2002/0151228 A1 * | 10/2002 | Kweon et al. ............... 439/887 |
| 2003/0114024 A1 | 6/2003 | Miyagawa |
| 2004/0190255 A1 | 9/2004 | Cheon |
| 2005/0067694 A1 | 3/2005 | Pon et al. |
| 2005/0110161 A1 * | 5/2005 | Naito et al. ................. 257/778 |
| 2005/0194695 A1 * | 9/2005 | Lin et al. .................... 257/777 |
| 2005/0218515 A1 * | 10/2005 | Kweon et al. ............... 257/737 |
| 2006/0126309 A1 | 6/2006 | Bolle et al. |
| 2007/0007665 A1 | 1/2007 | Clevenger et al. |
| 2007/0096327 A1 | 5/2007 | Kawamura et al. |
| 2007/0241449 A1 | 10/2007 | Colbert et al. |
| 2008/0073795 A1 | 3/2008 | Kohl et al. |
| 2008/0225493 A1 | 9/2008 | Barth |
| 2009/0052134 A1 | 2/2009 | Casteel et al. |
| 2009/0294954 A1 | 12/2009 | Bakir et al. |
| 2010/0019377 A1 | 1/2010 | Arvelo et al. |
| 2010/0117209 A1 | 5/2010 | Bezama et al. |
| 2010/0127390 A1 | 5/2010 | Barth |
| 2010/0187682 A1 | 7/2010 | Pinjala et al. |
| 2010/0187683 A1 | 7/2010 | Bakir et al. |
| 2011/0092064 A1 | 4/2011 | Liu et al. |
| 2011/0101527 A1 | 5/2011 | Cheng et al. |
| 2011/0205708 A1 | 8/2011 | Andry et al. |
| 2014/0147974 A1 | 5/2014 | Im et al. |

FOREIGN PATENT DOCUMENTS

| | | |
|---|---|---|
| KR | 20100066617 | 6/2010 |
| KR | 20120053284 | 5/2012 |

* cited by examiner

BUMP STRUCTURES FOR SEMICONDUCTOR PACKAGE

This application claims the benefit of U.S. Provisional Patent Application No. 61/695,560, filed Aug. 31, 2012 entitled, "Bump Structures for Semiconductor Package" which application is hereby incorporated herein by reference.

BACKGROUND

Semiconductor packaging utilizes bumps to establish electrical contact between a chip's Input/Output (I/O) pads and a substrate. Structurally, a bump structure contains a bump and a so-called under bump metallurgy (UBM) located between the bump and an I/O pad. The bumps themselves, based on the material and shape, are classified as solder balls, pillar bumps and metal bumps with mixed metals. Recently, instead of using solder balls, pillar bumps are used in the electronic component to achieve finer pitch with minimum probability of bump bridging, reduce capacitance load for the circuits and allow the electronic component to perform at higher frequencies. A solder alloy is still necessary for capping the bump structure and joining electronic components as well. Properly applied, pillar bumps can be placed in virtually any position on a chip, given the pitch considerations. In addition, redundant bumps can be added for symmetry, mechanical stability, additional thermal arrangement, or to optimize interconnect to reduce inductance and enhance speed.

DETAILED DESCRIPTION

Figure 1:
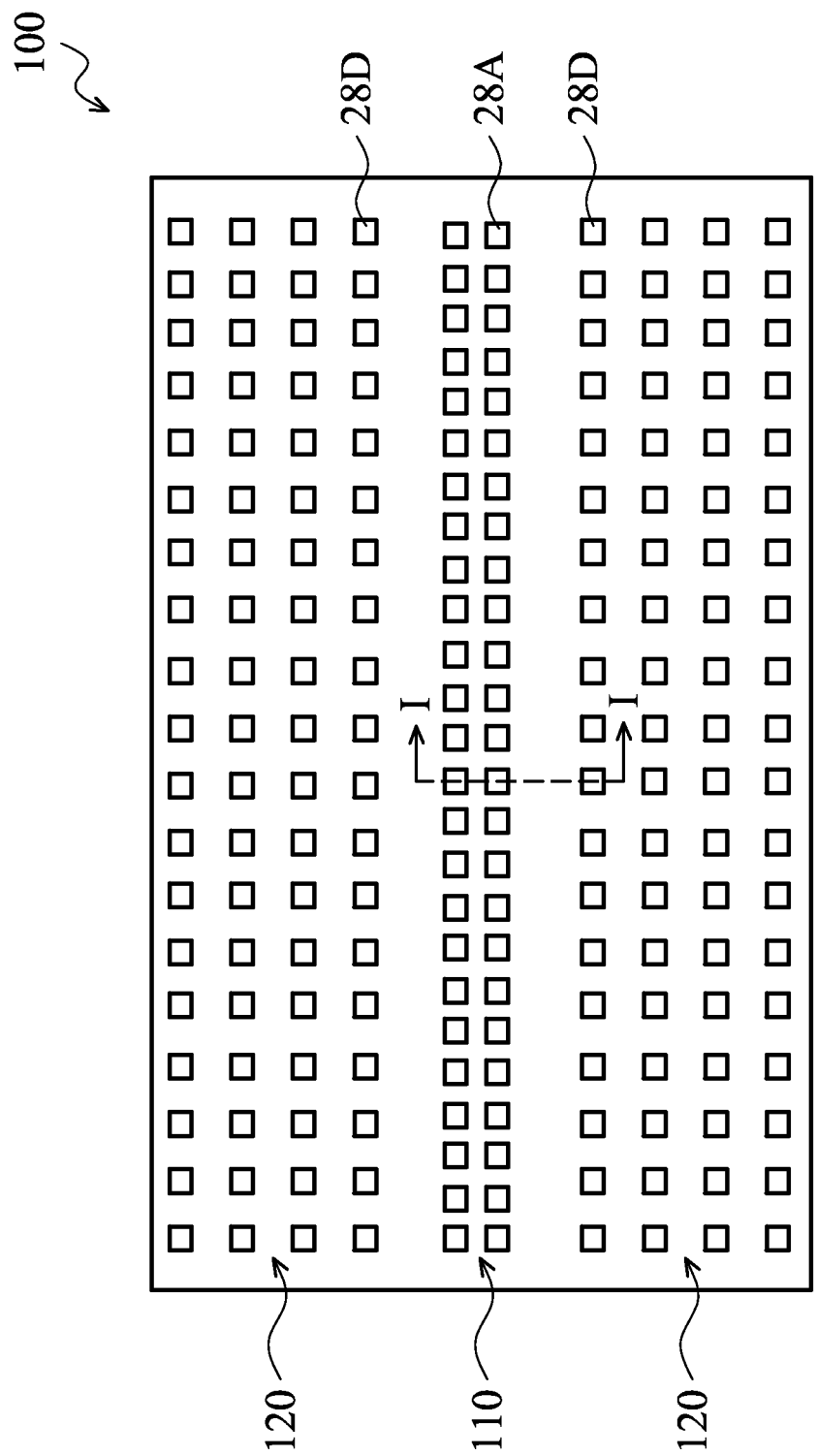
FIG. 1 is a plan view of a semiconductor chip having a plurality of bump structures in accordance with some embodiments.

It is to be understood that the following disclosure provides many different embodiments or examples, for implementing different features of various embodiments. Specific examples of components and arrangements are described below to simplify the present disclosure. The present disclosure may, however, be embodied in many different forms and should not be construed as being limited to the embodiments set forth herein; rather, these embodiments are provided so that this description will be thorough and complete, and will fully convey the present disclosure to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the present disclosure.

FIG. 1 is a plan view of a semiconductor chip having a plurality of bump structures in accordance with some embodiments.

Figure 2:
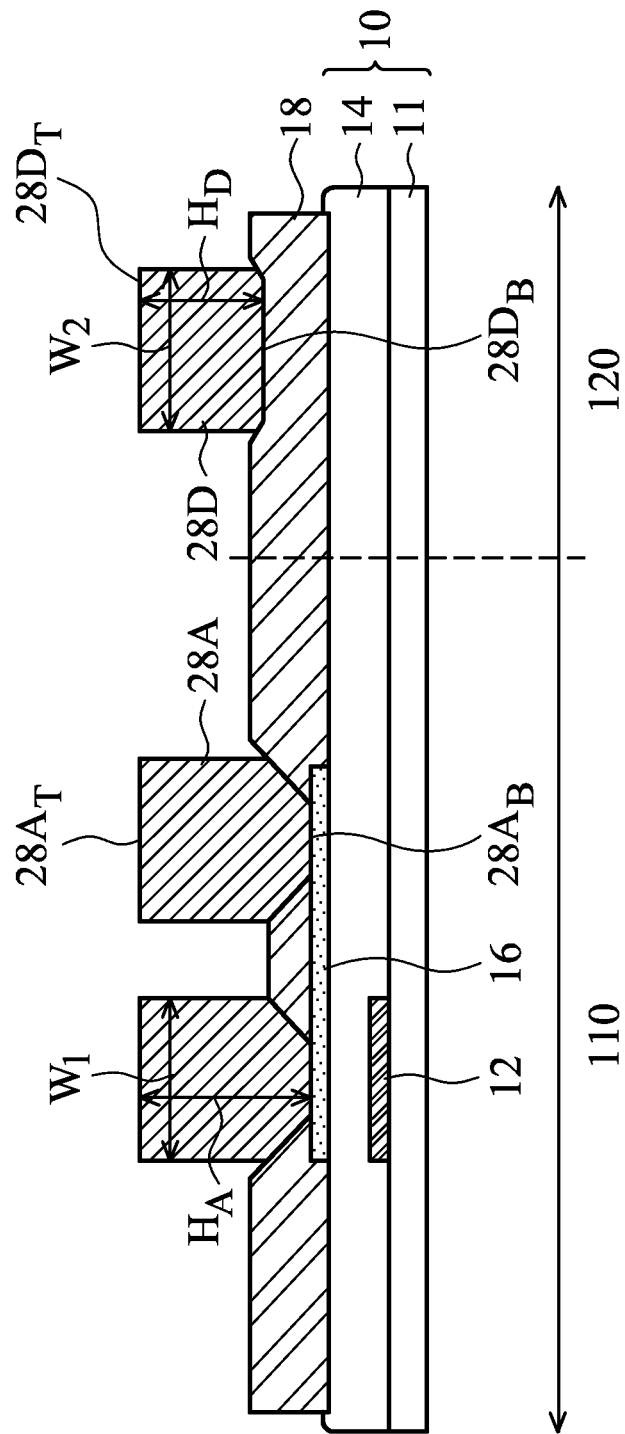
FIG. 2 is a cross-sectional view of the bump structures on the semiconductor chip taken along the line I-I of FIG. 1 in accordance with some embodiments.

As depicted in FIG. 1, a semiconductor chip 100 includes at least a first region 110 and a second region 120, wherein a plurality of first bump structures 28A are formed on the first region 110, and a plurality of second bump structures 28D are formed on the second region 120. In an embodiment, the first region 110 is in the central region of the chip 100, and the second region 120 is along the peripheral region of the chip 100. In some embodiments, the first bump structures 28A and the second bump structures 28D are pillar bump structures. In an embodiment, the plan-view profile of the bump structures 28A or 28D is square, and the plan-view profile of the bump structure 28A or 28D can be circular, rectangular, oval, octagonal, or the like according to some embodiments. The first bump structures 28A with first lateral dimensions $W_1$ (also referring to diameter or width of the first bump structures) present a first bump density in the first region 110, and the second bump structures 28D with second lateral dimensions $W_2$ (also referring to diameter or width of the second bump structures) present a second bump density in the second region 120. In an embodiment, the first bump density is different than the second bump density, while the first bump density can be the same as the second bump density in some embodiments. In an embodiment, the first lateral dimensions $W_1$ of the first bump structures 28A is uniform throughout the first region 110, and the second lateral dimensions $W_2$ of the second bump structures 28D is uniform throughout the second region 120. In an embodiment, the first lateral dimension $W_1$ is different than the second lateral dimension $W_2$, while the first lateral dimension $W_1$ can be the same as the second lateral dimension $W_2$ in some embodiments. As examples of the semiconductor chip 100, a logic chip or a memory chip is employed. In an embodiment, the first bump structures 28A function as active bumps, for example signal bumps, and the second bump structures 28D represent as dummy bumps without serving electrical connection between the chip 100 and any other substrate. In some embodiments, as depicted in FIG. 1, the first region 110 is smaller than the second region 120, the first bump density is greater than the second bump density, and the first lateral dimension $W_1$ is smaller than the second lateral dimension $W_2$. For example, the difference between $W_1$ and $W_2$ is about 1~10 μm FIG. 2 is a cross-sectional view of the bump structures on the semiconductor chip taken along the line I-I of FIG. 1 in accordance with some embodiments. The semiconductor chip 100 includes a first substrate 10, a metal pad 16 on the first substrate 10, and a passivation layer 18 overlying the metal pad 16. The first bump structures 28A are electrically connecting to the metal pad 16 through openings in the passivation layer 18, and the second bump structures 28D are positioned on the passivation layer 18 without electrical connecting to the metal pad 16. In some embodiments, the first substrate 10 includes a semiconductor substrate 11, an integrated circuit device 12 in and/or on the semiconductor substrate 11, and an interconnect structure 14 overlying the device 12 and the semiconductor substrate 11.

The first substrate 10 is employed in a semiconductor integrated circuit fabrication, and integrated circuits may be formed therein and/or thereupon. The semiconductor substrate 11 is defined to mean any construction comprising semiconductor materials including, but not limited to, bulk silicon, a semiconductor wafer, a silicon-on-insulator (SOI) substrate, or a silicon germanium substrate. Other semiconductor materials including group III, group IV, and group V elements may also be used.

The integrated circuit device 12 formed in and/or on the semiconductor substrate 11 may include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), resistors, diodes, capacitors, inductors, fuses, and other suitable elements. The microelectronic elements are interconnected to form the integrated circuit device, such as a logic device, memory device (e.g., static random access memory or SRAM), radio frequency (RF) device, input/output (I/O) device, system-on-chip (SoC) device, combinations thereof, and other suitable types of devices.

The interconnect structure 14 includes inter-layer dielectric layers (not shown) and metallization layers (not shown) overlying the integrated circuit device 12. The inter-layer dielectric layers include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. The metallization layers may be formed of, for example copper (Cu), aluminum (Al), AlCu, copper alloy, or other mobile conductive materials.

The metal pad 16 is a metallization layer formed on a top-level inter-layer dielectric layer of the interconnect structure 14. In an embodiment, the metal pad 16 is formed in the first region 110 of the semiconductor chip 100. In some embodiments, the metal pad 16 is formed on the first region 110 and the second region 120 as well. Suitable materials for the metal pad 16 may include, but are not limited to, for example Cu, Al, AlCu, copper alloy, or other mobile conductive materials. The metal pad 16 provides an electrical connection upon which the first bump structures 28A are formed for external connections in subsequent processing steps.

The passivation layer 18 is formed on the interconnect structure 14 and covers some portions of the metal pad 16, while some portions of the metal pad 16 within the first region 110 are exposed by openings 19 (see FIG. 3A and 3B) in the passivation layer 18. In some embodiments, the passivation layer 18 includes a dielectric layer, a polymer layer, or combinations thereof. The passivation layer 18 may be a single layer or a laminated layer. In FIG. 2, a single layer of the passivation layer 18 is shown for illustrative purposes only. As such, other embodiments may include any number of passivation layers. The passivation layer 18 may have a single opening or a plurality of openings 19 on one metal pad 16. In FIG. 2, the passivation layer 18 having two openings 19 is shown for illustrative purposes only. As such, other embodiments may include any number of openings 19 in the passivation layer 18 over one metal pad 16.

The bump structures 28A and 28D are formed after the formation of the patterned passivation layer 18 with openings 19. In some embodiments, the first bump structures 28A are formed on the exposed portions of the metal pad 16 within the first region 110, and the second bump structures 28D are formed on the passivation layer 18 within the second region 120. In at least one embodiment, the bump structures 28A and 28D are formed of pillar bumps. The pillar bumps are formed of conductive materials. In some embodiments, the pillar bump includes an under-bump metallization (UBM) layer, a metal pillar and at least one capping layer. The metal pillar may include Cu, Cu alloy, gold (Au), Au alloy or the like. The capping layer may include nickel (Ni), solder, Au, palladium (Pd), or any other noble metals.

On the first region 110, the first bump structure 28A has a first bump height $H_A$ that is measured from the bottom side 28$A_B$ of the first bump structure 28A to the top side 28$A_T$ of the first bump structure 28A. On the second region 120, the second bump structure 28D has a second bump height $H_D$ that is measured from the bottom side 28$D_B$ of the second bump structure 28D to the top side 28$D_T$ of the second bump structure 28D. The second bump structures 28D are positioned on the passivation layer 18 with a thickness $T_{18}$. In some embodiments, the thickness $T_{18}$ is greater than about 3 μm. For example the thickness $T_{18}$ is between about 1 μm and about 20 μm.

For reducing or eliminating the gap between the top sides of the two bump structures, the second bump height $H_D$ is well controlled to make the top side 28$A_T$ of the first bump structure 28A being substantially leveled with the top side 28$D_T$ of the second bump structure 28D according to some embodiments. For example, the gap between the top side 28$A_T$ and the top side 28$D_T$ can be controlled at a range of about 0 to about 5 μm, at a range of about 0 to about 3 μm or at a range of about 0 to about 1 μm. In some embodiments, the first bump height $H_A$ is greater than the second bump height $H_D$. For example, the difference between the first bump height $H_A$ and the second bump height $H_D$ is at the range between about 1 nm and about 20 nm. The minimized gap between the top side 28$A_T$ and the top side 28$D_T$ makes control of standoff possible for a package structure with the chip 100 bonded to another substrate. The exemplary package structure involves the chip on a package substrate with bump structures, the chip on a wafer with bump structures, or the chip on another chip with bump structures. By controlling the bump within the chip 100, variation of standoffs between the chip 100 and the other substrate can be minimized, such that the standoffs become more uniform and quality of dispensing underfill in the package structure is improved. In some embodiments, the mechanisms for providing coplanar bump structures can be applied to the manufacture of bump structures with different critical dimension on different regions within the chip.

FIGS. 3A through 3D are cross-sectional views of intermediate stages in the manufacturing of bump structures in accordance with an embodiment. Unless specified otherwise, the reference numerals in these embodiments represent like elements in the embodiments illustrated in FIGS. 1-2.

Figure 3A:
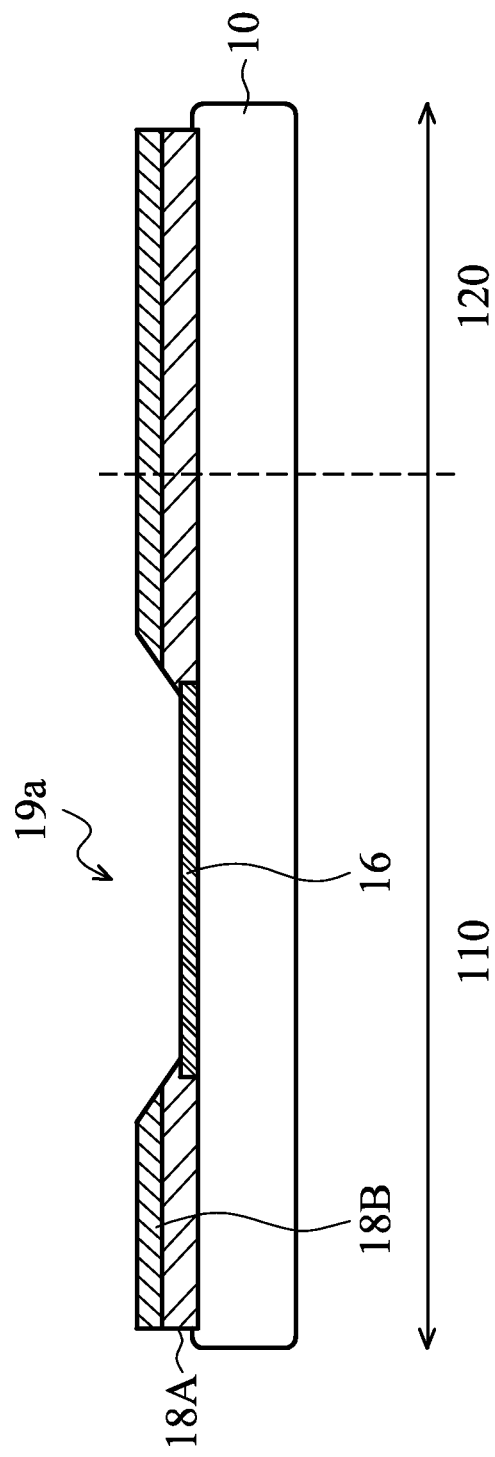
FIGS. 3A through 3D are cross-sectional views of intermediate stages in the manufacturing of bump structures in accordance with an embodiment.

Referring to FIG. 3A, the first substrate 10, for example a wafer-level form including a plurality of chip regions is provided with the integrated circuit device 12 (see FIG. 2) formed in or on the semiconductor substrate 11, the interconnect structure 14 formed on the semiconductor substrate 11, and the metal pad 16 formed on the interconnect structure 14. In an embodiment, each chip region includes the first region 110 and the second region 120, and the metal pad 16 is formed over the interconnect structure 14 in the first region 110. The passivation layer 18 is formed on the interconnect structure 14 and covering portions of the metal pad 16. In some embodiments, the formation of the passivation layer 18 includes successively forming a dielectric layer 18A and a first polymer layer 18B over the first substrate 10 and then forming an opening 19a in the stack of the layers 18A and 18B such that a portion of the metal pad 16 is exposed. In some embodiments, the dielectric layer 18A includes undoped silicate glass (USG), silicon nitride, silicon oxide, silicon oxynitride or a non-porous material by any suitable method, such as CVD, PVD, or the like. The dielectric layer 18A may be a single layer or a laminated layer. In some embodiments, the first polymer layer 18B is formed of epoxy, polyimide, benzocyclobutene (BCB), polybenzoxazole (PBO), and the like, although other relatively soft, often organic, dielectric materials can also be used. In an embodiment, the opening 19a is formed to pass through the dielectric layer 18A and the first polymer layer 18B and expose a central portion of the metal pad 16.

Figure 3B:
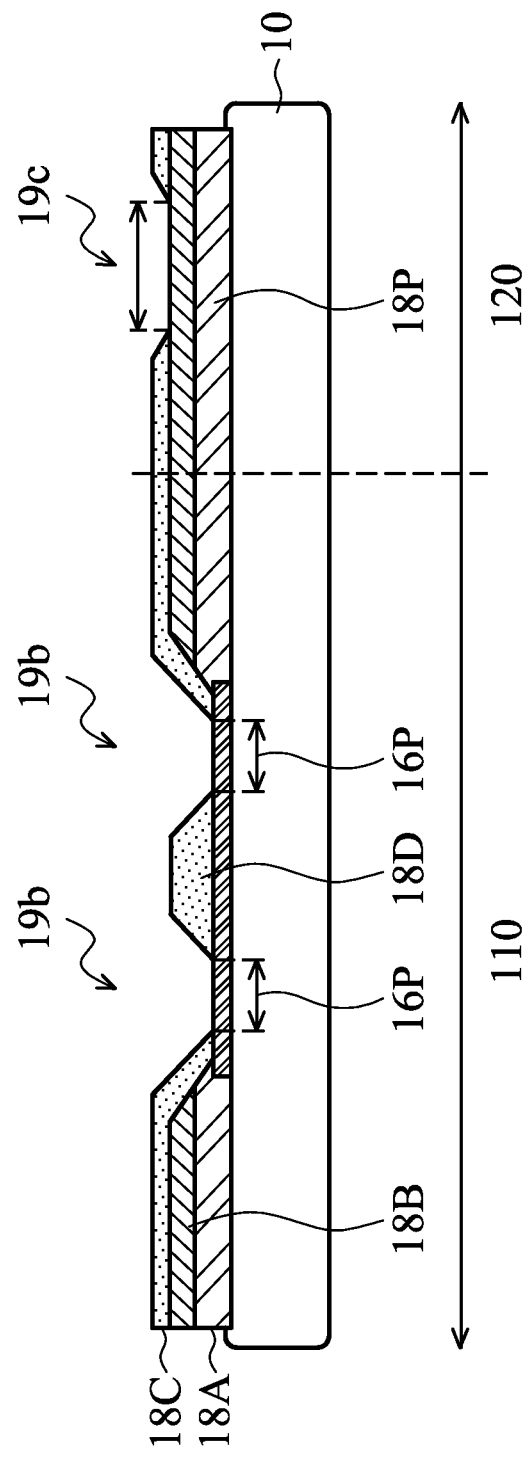

Referring to FIG. 3B, the formation of the passivation layer 18 further includes forming a second polymer layer 18C on the resulted structure as depicted in FIG. 3A. In some embodiments, the second polymer layer 18C is formed of epoxy, polyimide, benzocyclobutene (BCB), polybenzoxazole (PBO), and the like, although other relatively soft, often organic, dielectric materials can also be used. Then another openings 19b and opening 19c are formed in the second polymer layer 18C. The openings 19b are formed in the second polymer layer 18C within the first region 110 to expose connection portions 16P of the metal pad 16. In an embodiment, the second polymer layer 18C remaining on the metal pad 16 forms at least one polymer buffer 18D which separates the two adjacent openings 19b. The opening 19c is formed in the second polymer layer 18C within the second region 120 to expose a landing portion 18P of the first polymer layer 18B.

Figure 3C:
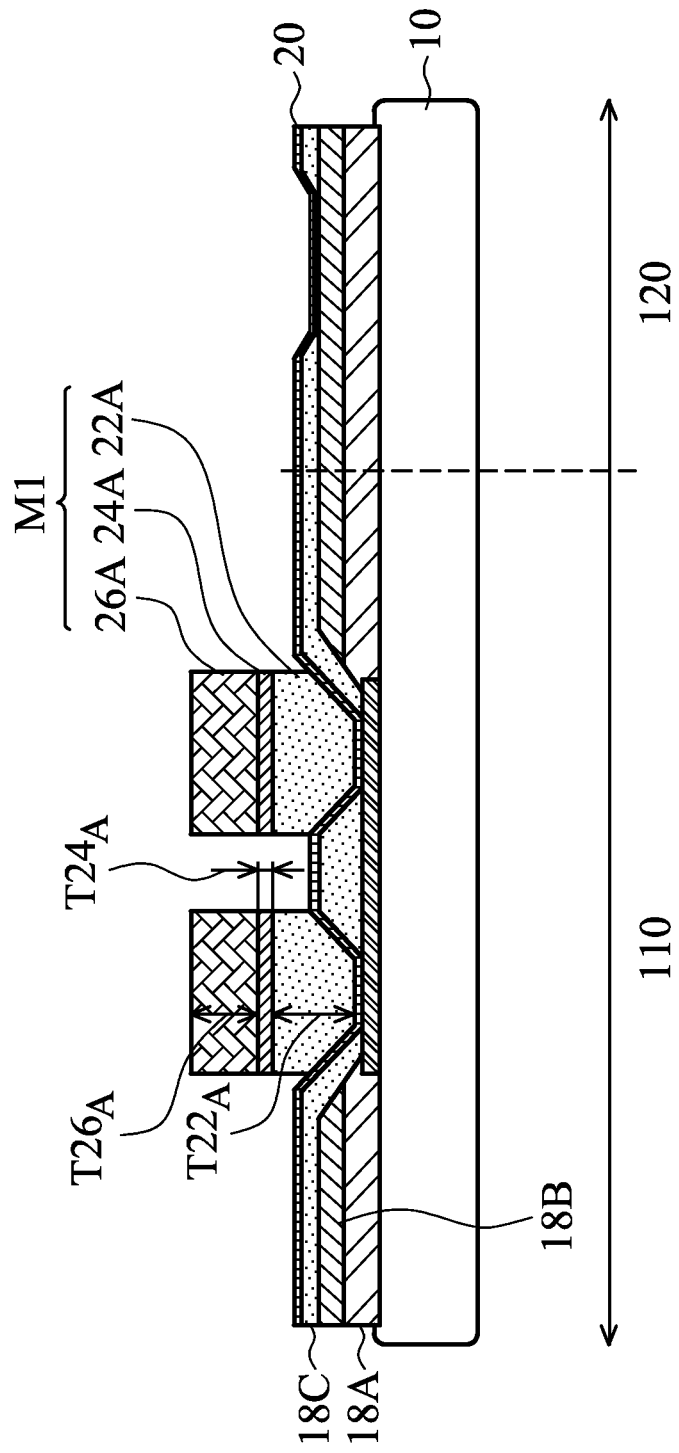

Referring to FIG. 3C, an under-bump metallization (UBM) layer 20 is formed on the resulted structure shown in FIG. 3B. The UBM layer 20 covers the second polymer layer 18C, the connection portions 16P of the metal pad 16, and the landing portion 18P of the first polymer layer 18B. In at least one embodiment, the UBM layer 20 includes a diffusion barrier layer (not shown), which is formed of titanium, tantalum, titanium nitride, tantalum nitride, or the like. In some embodiments, the UBM layer 20 further includes a seed layer (not shown) formed on the diffusion barrier layer. The seed layer may be formed of copper, copper alloys that include silver, chromium, nickel, tin, gold, and combinations thereof.

Next, first metal stacks M1 are formed on the UBM layer 20 over the connection portions 16P. In an embodiment, the first metal stack M1 including a first metal pillar 22A, a first metal capping layer 24A and a first solder capping layer 26A is formed on the UBM layer 20 positioned directly over each connection portion 16P within the first region 110. The formation of the first metal stack M1 is, for example through photoresist masking, photolithography, plating, and dry/wet etching processes. In at least one embodiment, the first metal pillar 22A is intended to include a layer including substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum, cobalt or zirconium. In at least one exemplary embodiment, the first metal pillar 22A has a thickness $T_{22A}$ of less than about 20 µm. In another exemplary embodiment, the thickness $T_{22A}$ is of about 1 to about 20 µm, although the thickness may be greater or smaller.

The first metal capping layer 24A is formed on top of the first metal pillar 22A. The first metal capping layer 24A can act as a barrier layer to prevent copper in the first metal pillar 22A from diffusing into a bonding material, such as solder alloy, that is used to connect first substrate 10 to external features. The prevention of copper diffusion increases the reliability and bonding strength of the electronics package. In some embodiments, the first metal capping layer 24A is a metallization layer which may include nickel, tin, tin-lead (SnPb), gold (Au), silver (Ag), palladium (Pd), Indium (In), platinum (Pt), nickel-palladium-gold (NiPdAu), nickel-gold (NiAu), other similar materials, or alloys. The first metal capping layer 24A may be a multi-layered structure or a single-layered structure. In an embodiment, the first metal capping layer 24A has a thickness $T_{24A}$ of less than about 5 µm. In other embodiments, the thickness $T_{24A}$ is between about 0.5 µm to about 3 µm.

The first solder capping layer 26A is formed on top of the first metal capping layer 24A. In some embodiments, the first solder capping layer 26A is made of a lead-free solder material, such as Sn, SnAg, Sn—Pb, SnAgCu (with Cu weight percentage less than or equal to about 0.5%), SnAgZn, SnZn, SnBi—In, Sn—In, Sn—Au, SnPb, SnCu, SnZnIn, SnAgSb, and other similarly appropriate material by plating methods. In at least one embodiment, the first solder capping layer 26A is formed with a controlled volume. In an embodiment, the first solder capping layer 26A is formed of a controlled thickness $T_{26A}$ less than about 10 µm. In another embodiment, the thickness $T_{26A}$ is less than or equal to about 7 µm. In at least another embodiment, the thickness $T_{26A}$ is controlled at a range between about 2 µm and about 7 µm.

Figure 3D:
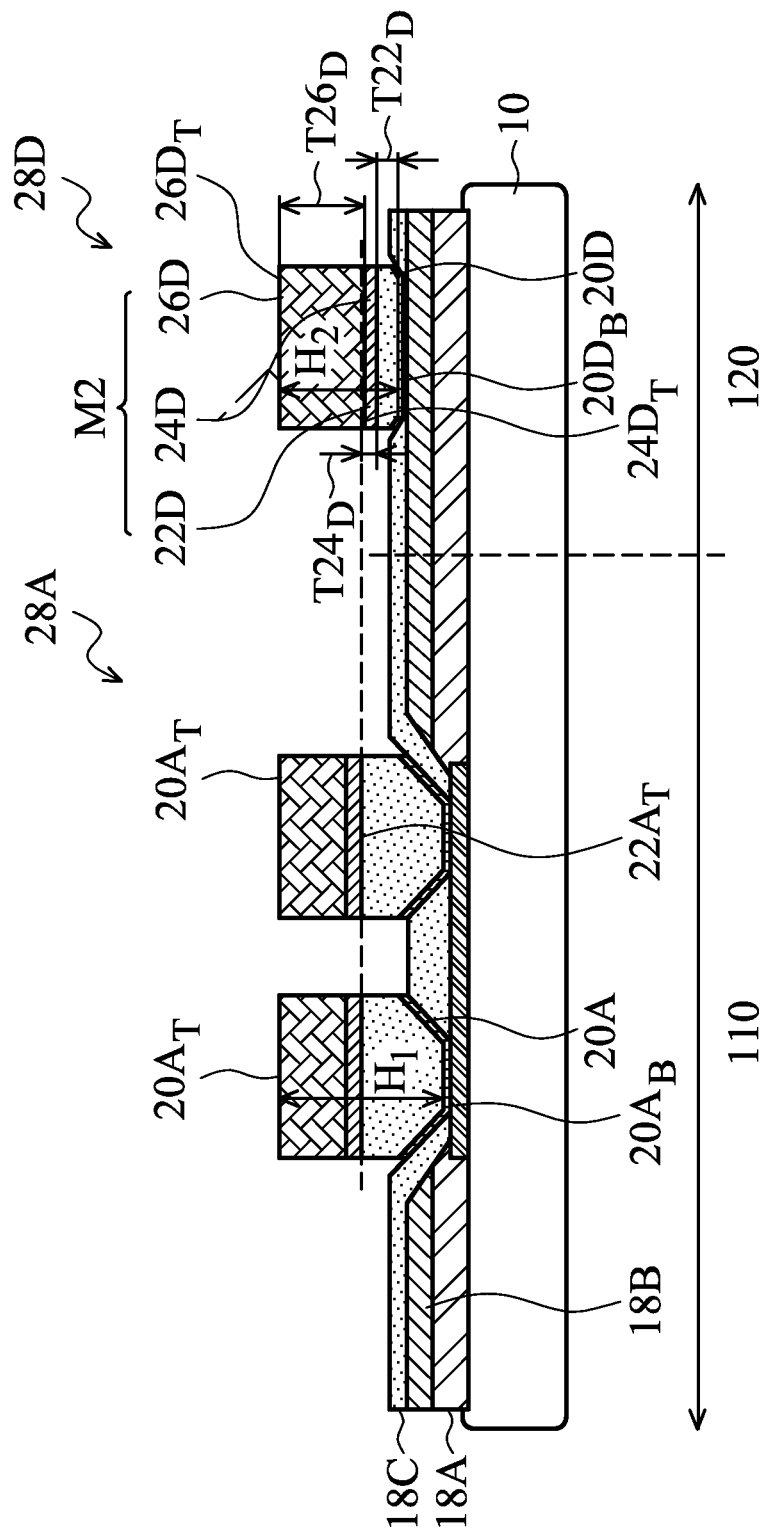

Referring to FIG. 3D, a second metal stack M2 is formed on the UBM layer 20 and positioned directly over the landing portions 18P within the second region 120. In an embodiment, the second metal stack M2 includes a second metal pillar 22D, a second metal capping layer 24D and a second solder capping layer 26D. The formation of the second metal stack M2 is, for example through photoresist masking, photolithography, plating, and dry/wet etching processes. In at least one embodiment, the second metal pillar 22D includes a layer including substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. In an embodiment, the second metal pillar 22D has a thickness $T_{22D}$, which is less than the thickness $T_{22A}$ of the first metal pillar 22A. For example, the thickness $T_{22D}$, is less than 5 μm, although the thickness may be greater or smaller. In some embodiments, the ratio of $T_{22A}$ to $T_{22D}$ is about 1 to about 4 μm.

The second metal capping layer 24D is formed on top of the second metal pillar 22D. In some embodiments, the second metal capping layer 24D is a metallization layer which may include nickel, tin, tin-lead (SnPb), gold (Au), silver (Ag), palladium (Pd), Indium (In), platinum (Pt), nickel-palladium-gold (NiPdAu), nickel-gold (NiAu), other similar materials, or alloys. The second metal capping layer 24D may be a multi-layered structure or a single-layered structure. In an embodiment, the second metal capping layer 24D has a thickness $T_{24D}$ substantially equal to the thickness $T_{24A}$ of the first metal capping layer 24A. In an embodiment, the thickness $T_{24D}$ is less than about 5 μm. For example, the thickness $T_{24D}$ is between about 0.5 μm to about 3 μm.

The second solder capping layer 26D is formed on top of the second metal capping layer 24D. In some embodiments, the second solder capping layer 26D is made of a lead-free solder material, such as Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, SnAgSb, and other similarly appropriate material by plating methods. In an embodiment, the second solder capping layer 26D is formed of a thickness $T_{26D}$ greater than the thickness $T_{26A}$ of the first solder capping layer 26A. In some embodiments, the thickness $T_{26D}$ is less than about 10 μm. In another embodiment, the thickness $T_{26D}$ is less than or equal to about 7 μm. In at least another embodiment, the thickness $T_{26D}$ is controlled at a range between about 2 μm and about 7 μm.

After the formation of the first metal stack M1 and the second metal stack M2, exposed portions of the UBM layer 20 are removed. In some embodiments, the remaining portion of the UBM layer 20 underlying the first metal pillar 22A is referred to as a first UBM layer 20A, and the remaining portion of the UBM layer 20 underlying the second metal pillar 22D is referred to as a second UBM layer 20D. Accordingly, the first bump structure 28A is the stack including the first UBM layer 20A, the first metal pillar 22A, the first metal capping layer 24A and the first solder capping layer 26A. The second bump structure 28D is the stack including the second UBM layer 20D, the second metal pillar 22D, the second metal capping layer 24D and the second solder capping layer 26D. In an embodiment, the top surface $26A_T$ of the first solder capping layer 26A is substantially leveled with the top surface $26D_T$ of the second solder capping layer 26D by controlling the thickness $T_{22D}$ of the second metal pillar 22D and the thickness $T_{26D}$ of the second solder capping layer 26D. For example, the gap between the top surface $26A_T$ and the top surface $26D_T$ can be controlled at ranges of about 0 to about 5 μm, about 0 to about 3 μm or about 0 to about 1 μm. As depicted in FIG. 3D, the first bump structure 28A has a first bump height $H_1$ that is measured from the bottom surface $20A_B$ of the first UBM layer 20A to the top surface $26A_T$ of the first solder capping layer 26A. The second bump structure 28D has a second bump height $H_2$ that is measured from the bottom surface $20D_B$ of the second UBM layer 20D to the top surface $26D_T$ of the second solder capping layer 26D. Since the second bump structure 28D is positioned on the layers 18A and 18B, the first bump height $H_1$ is greater than the second bump height $H_2$ according to an embodiment. For example, the difference between the first bump height $H_1$ and the second bump height $H_2$ is at the range between about 1 nm and about 20 nm. By controlling the thickness of the metal pillars 22A and 22D in different regions 110 and 120, the top of the first bump structure 28A is substantially leveled with the top of the second bump structures 28D. In some embodiments, the top surface $22A_T$ of the first metal pillar 22A is substantially leveled with the top surface $24D_T$ of the second metal capping layer 24D.

Figure 4:
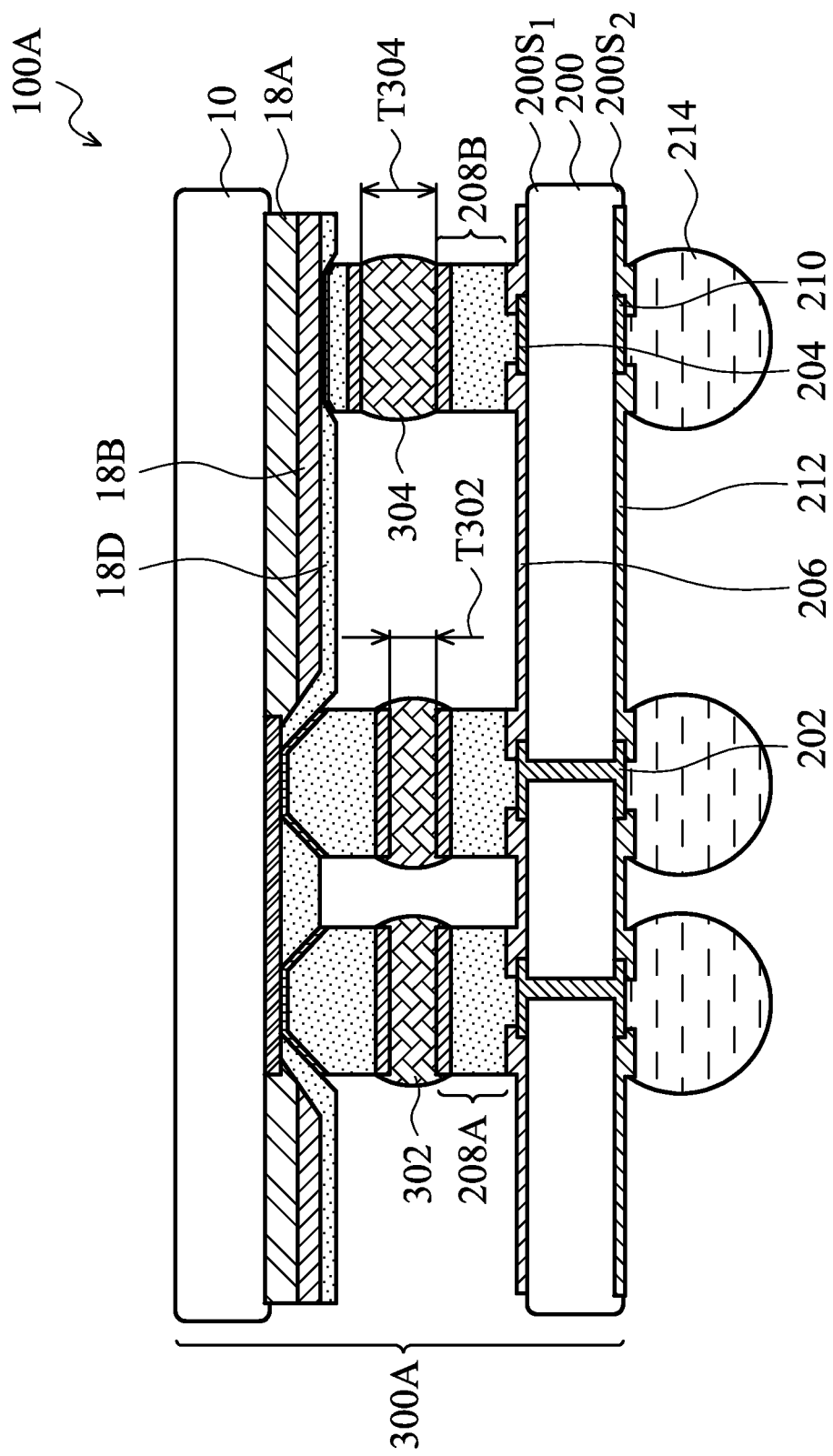
FIG. 4 is a cross-sectional view of a package structure with the semiconductor chip shown in FIG. 3D in accordance with some embodiments.

In some embodiments, the first substrate 10 includes a number of chip regions that are sawed and separated from each other to form individual chips 100A in accordance with some embodiments. FIG. 4 depicts in a cross-sectional view of a package structure 300A with the chip 100A bonded on a second substrate 200 in accordance with some embodiments. The second substrate 200 may be a semiconductor wafer, a portion of a semiconductor wafer, a semiconductor chip, a package substrate, or a circuit board. In some embodiments, the second substrate 200 includes silicon, gallium arsenide, silicon on insulator, glass, ceramic, plastic, organic materials, tape film, or other supporting materials. In some embodiments, the second substrate 200 also includes passive devices such as resistors, capacitors, inductors and the like, or active devices such as transistors. In some embodiments, the second substrate 200 includes through vias 202 as shown in FIG. 4. The through vias 202 can be formed of copper, copper alloy or other conductive materials according to some embodiments. In an embodiment, the second substrate 200 functions as an interposer for interconnecting at least one integrated circuit chip to another chip, wafer or substrate. In some embodiments, the second substrate 200 includes a plurality of first contact pads 204 on a first side $200S_1$, a first dielectric layer 206 on the first side $200S_1$ and covering portions of the contact pads 204, and a plurality of connectors 208A and 208B landing on the exposed portions of the first contact pads 204 respectively. The connectors 208A and 208B can be formed of metal stacks with the same materials, and a uniform lateral dimension according to some embodiments. In an embodiment, the connector 208A or 208B includes a metal pillar formed of copper or copper alloy. In some embodiments, the connector 208A or 208B also includes at least one metal capping layer formed of nickel, gold, or solder on the metal pillar. In some embodiments, the second substrate 200 also includes a plurality of second contact pads 210 on a second side $200S_2$ opposite to the first side $200S_1$, a second dielectric layer 212 on the second side $200S_2$ and covering portions of the second contact pads 210, and a plurality of connectors 214 placed on the exposed portions of the second contact pads 210 respectively. In some embodiments, the connectors 214 are solder balls to form a connection between the second substrate and the underlying substrate (not shown).

The package structure 300A in FIG. 4 shows the chip 100 bonded to the second substrate 200 by connecting the bumps structures 28A and 28D on the first substrate 10 to the connectors 208A and 208B on the second substrate 200. By solder reflowing process, a first solder joint region 302 is formed between the first bump structure 28A and the first connector 208A, and a second solder joint region 304 is formed between the second bump structure 28D and the second connector 208B. The thickness $T_{302}$ of the first solder joint region 302 may be varied depending on the volume of the first solder capping layer 26A and the volume of solder material on the first connector 208A, and the thickness $T_{304}$ of the second solder joint region 304 may be varied depending on the volume of the second solder capping layer 26D and the volume of solder material on the second connector 208B. In an embodiment, the thickness $T_{304}$ of the second solder joint region 304 is greater than the thickness $T_{302}$ of the first solder joint region 302. The distance between first substrate 10 and the second substrate 200, is called the "standoff". In some embodiments, an underfill material is applied to fill the space between the chip 100 and the second substrate 200 for preventing cracks in the solder joint regions. By controlling the heights of the bump structures 28A and 28D within the chip 100A, variation of standoffs between the chip 100A and the substrate 200 can be minimized, such that the standoffs become more uniform and the underfill formation process is controllable and repeatable. The exemplary chip packages described above involve chips on substrates with bump structures. However, in some embodiments, the application of bump structures is applied to chip packages involving chips on substrates without bump structures.

Figure 5A:
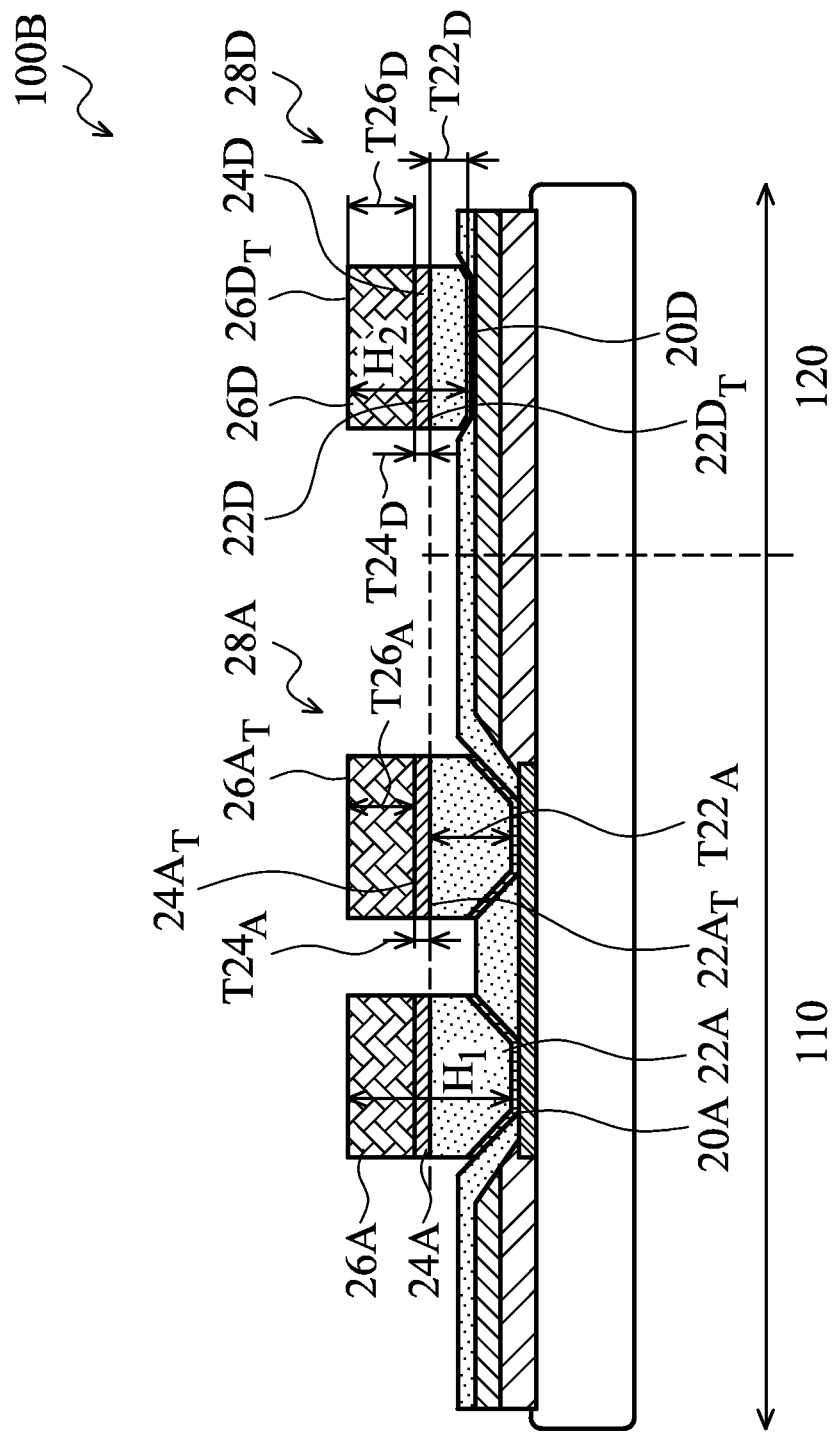
FIG. 5A is a cross-sectional view of bump structures on a semiconductor chip in accordance with some embodiments.
Figure 5B:
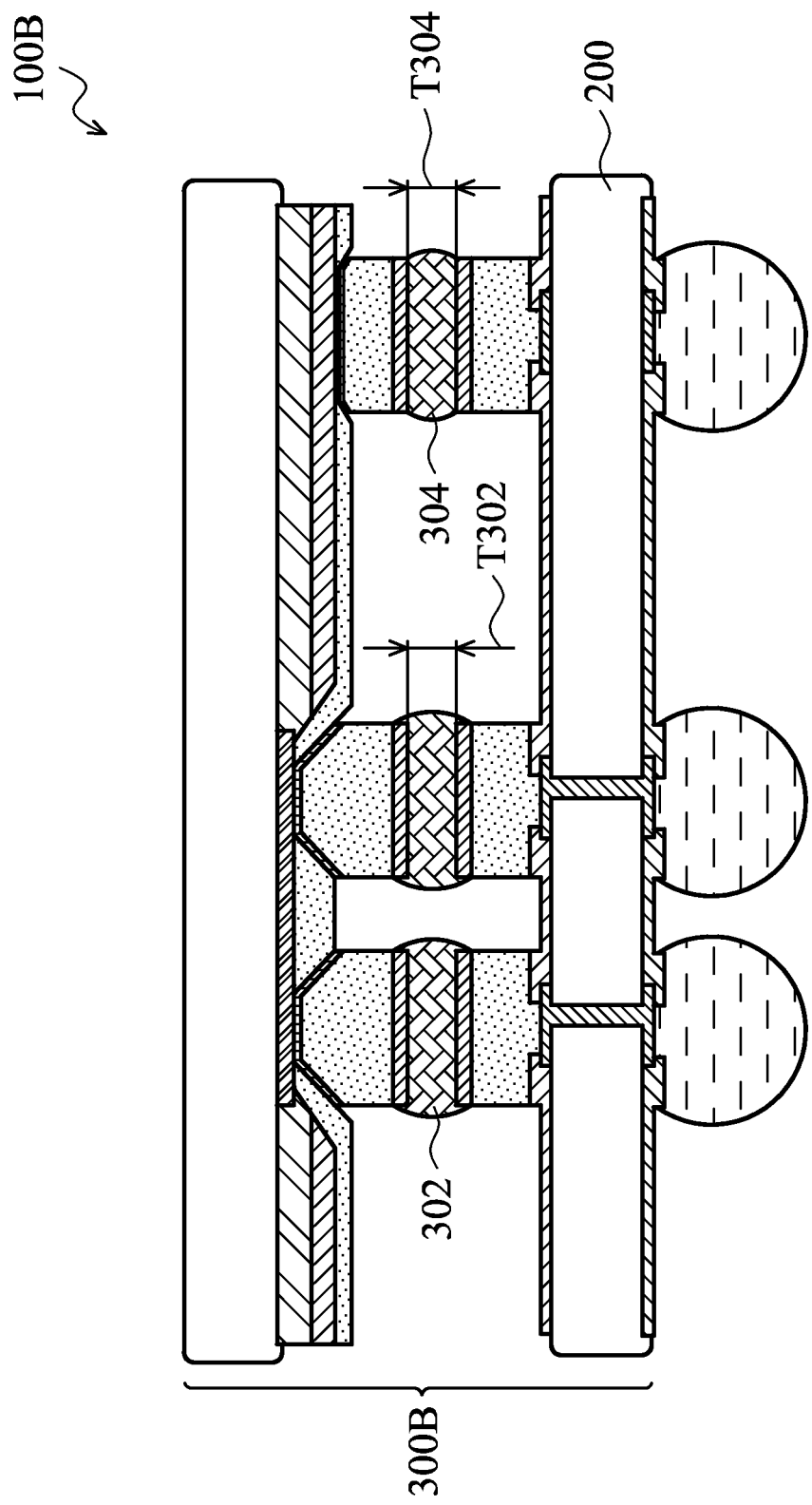
FIG. 5B is a cross-sectional view of a package structure with the semiconductor chip shown in FIG. 5A in accordance with some embodiments.

FIG. 5A is a cross-sectional view of bump structures on a semiconductor chip 100B in accordance with some embodiments, and FIG. 5B is a cross-sectional view of a package structure 300B with the semiconductor chip 100B bonded to the second substrate 200 in accordance with some embodiments. Unless specified otherwise, the reference numerals in these embodiments represent like elements in the embodiments illustrated in FIGS. 1-4.

Referring to FIG. 5A, by controlling the thickness of the metal pillars 22A and 22D in different regions 110 and 120 on the chip 100B, the top of the first bump structure 28A is substantially leveled with the top of the second bump structures 28D. Accordingly, the top surface $26A_T$ of the first solder capping layer 26A is substantially leveled with the top surface $26D_T$ of the second solder capping layer 26D. Since the first bump structure 28A is positioned on the metal pad 16 and the second bump structure 28D is positioned on the layers 18A and 18B, the first bump height $H_1$ is greater than the second bump height $H_2$. In some embodiments, the thicknesses of layers in the bump structures 28A and 28D satisfy the following criteria. $T_{22A}$ is greater than $T_{22D}$, $T_{24A}$ is substantially equal to $T_{24D}$, and $T_{26A}$ is substantially equal to $T_{26D}$. For example, the difference between $T_{22A}$ and $T_{22D}$, is about 1 to about 20 μm. In some embodiments, the top surface $22A_T$ of the first metal pillar 22A is substantially leveled with the top surface $22D_T$ of the second metal pillar 22D. Referring to FIG. 5B, the package structure 300B shows the chip 100B bonded to the second substrate 200 by connecting the bumps structures 28A and 28D on the first substrate 10 to the first connectors 208A and 208B, respectively, on the second substrate 200. In an embodiment, the thickness $T_{304}$ of the second solder joint region 304 is substantially equal to the thickness $T_{302}$ of the first solder joint region 302.

Figure 6A:
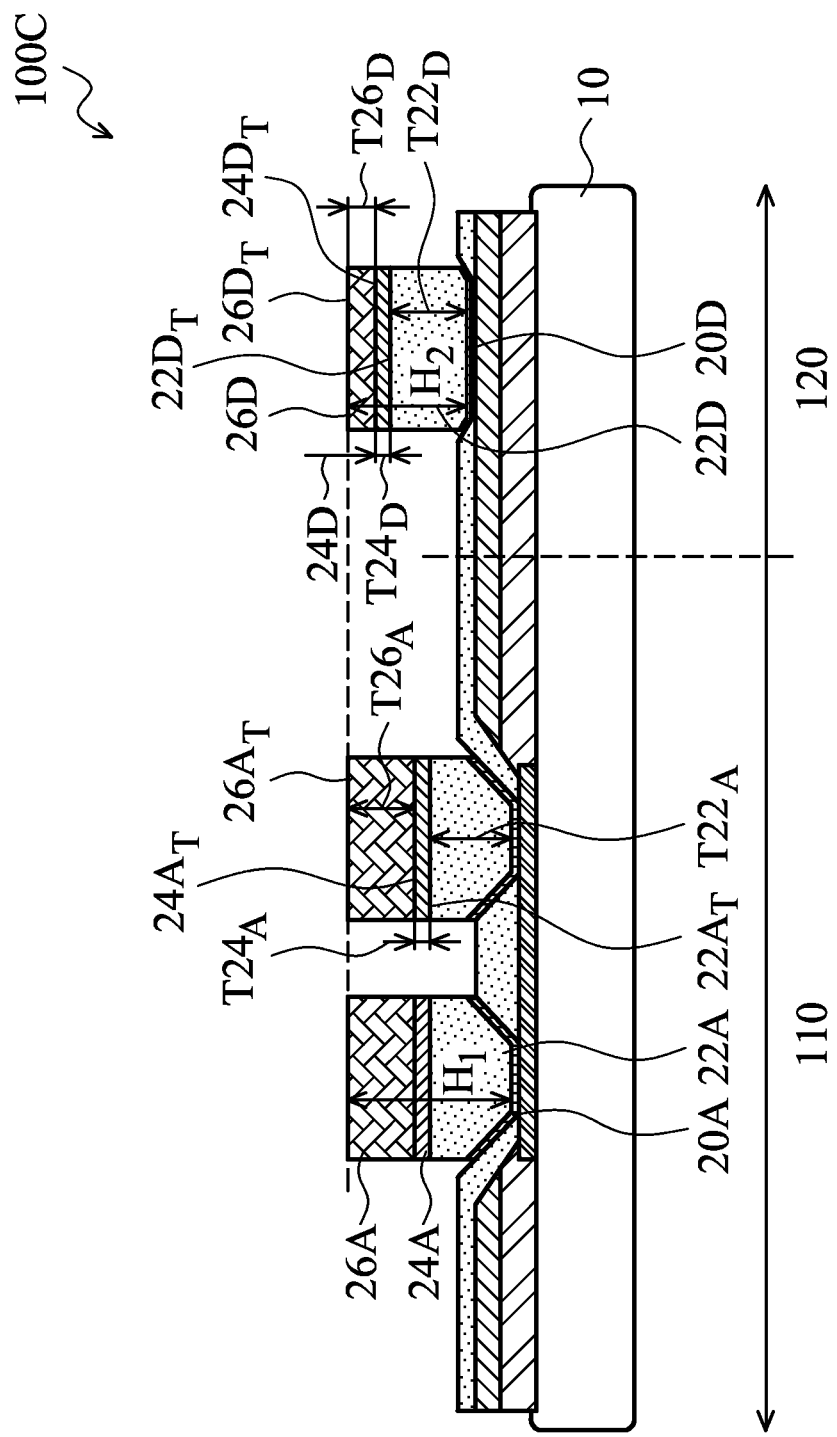
FIG. 6A is a cross-sectional view of bump structures on a semiconductor chip in accordance with some embodiments.
Figure 6B:
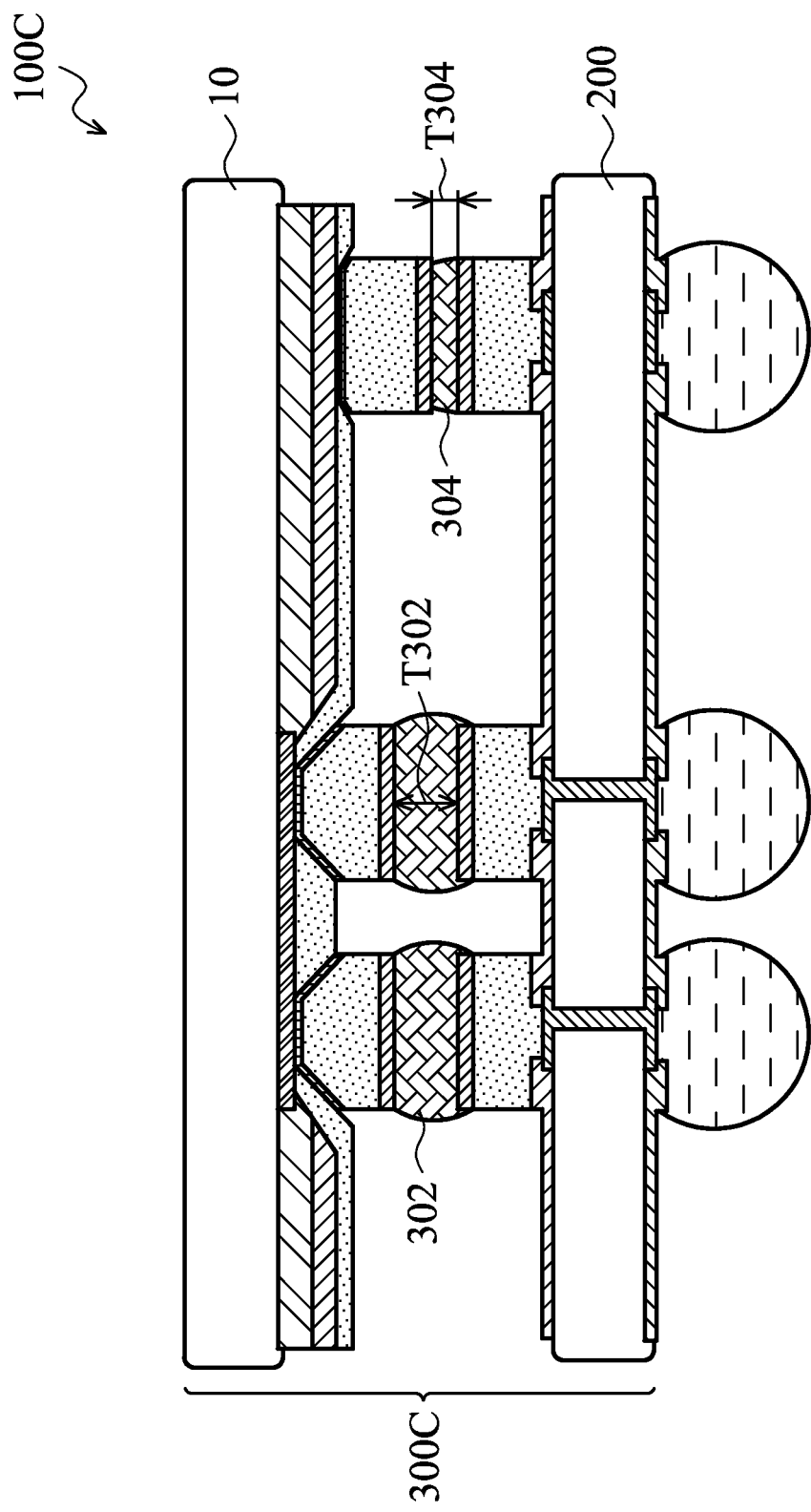
FIG. 6B is a cross-sectional view of a package structure with the semiconductor chip shown in FIG. 6A in accordance with some embodiments.

FIG. 6A is a cross-sectional view of bump structures on a semiconductor chip 100C in accordance with some embodiments, and FIG. 6B is a cross-sectional view of a package structure 300C with the semiconductor chip 100C bonded to the second substrate 200 in accordance with some embodiments. Unless specified otherwise, the reference numerals in these embodiments represent like elements in the embodiments illustrated in FIGS. 1-4.

Referring to FIG. 6A, by controlling the thickness of the solder capping layers 26A and 26D in different regions 110 and 120 on the chip 100C, the top of the first bump structure 28A is substantially leveled with the top of the second bump structures 28D. Accordingly, the top surface $26A_T$ of the first solder capping layer 26A is substantially leveled with the top surface $26D_T$ of the second solder capping layer 26D. In some embodiments, the bump heights and the thicknesses of layers in the bump structures 28A and 28D satisfy the following criteria. $H_1$ is greater than $H_2$, $T_{22A}$ is substantially equal to $T_{22D}$, $T_{24A}$ is substantially equal to $T_{24D}$, and $T_{26A}$ is greater than $T_{26D}$. For example, the ratio of $T_{26A}$ to $T_{26D}$ is at the range from about 1.5 to about 3. For another example, the difference between $T_{26A}$ to $T_{26D}$ is about 1 to about 10 μm. In some embodiments, the top surface $22A_T$ of the first metal pillar 22A is lower than the top surface $22D_T$ of the second metal pillar 22D, and the top surface $24A_T$ of the first metal capping layer 24A is lower than the top surface $24D_T$ of the second metal capping layer 24D. Referring to FIG. 6B, the package structure 300C shows the chip 100C bonded to the second substrate 200 by connecting the bumps structures 28A and 28D on the first substrate 10 to the connectors 208A and 208B, respectively, on the second substrate 200. In an embodiment, the thickness $T_{302}$ of the first solder joint region 302 is greater than the thickness $T_{304}$ of the second solder joint region 304. For example, the ratio of $T_{304}$ to $T_{302}$ is at the range from about 1.5 to about 3.

Figure 7A:
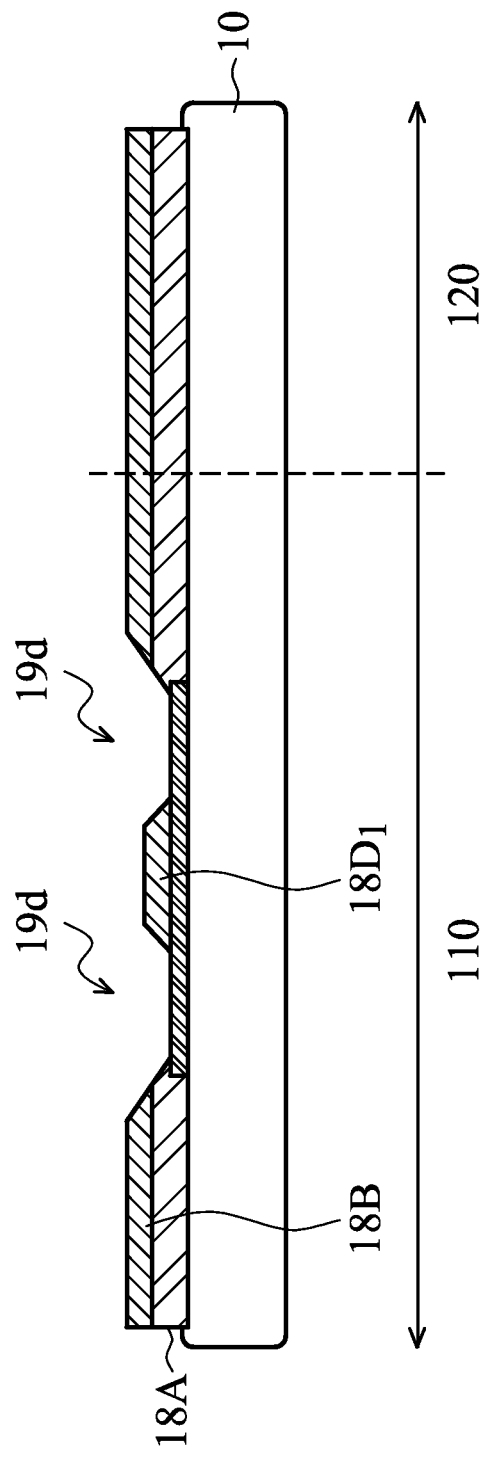
FIGS. 7A through 7C are cross-sectional views of intermediate stages in the manufacturing of bump structures in accordance with an embodiment.
Figure 7B:
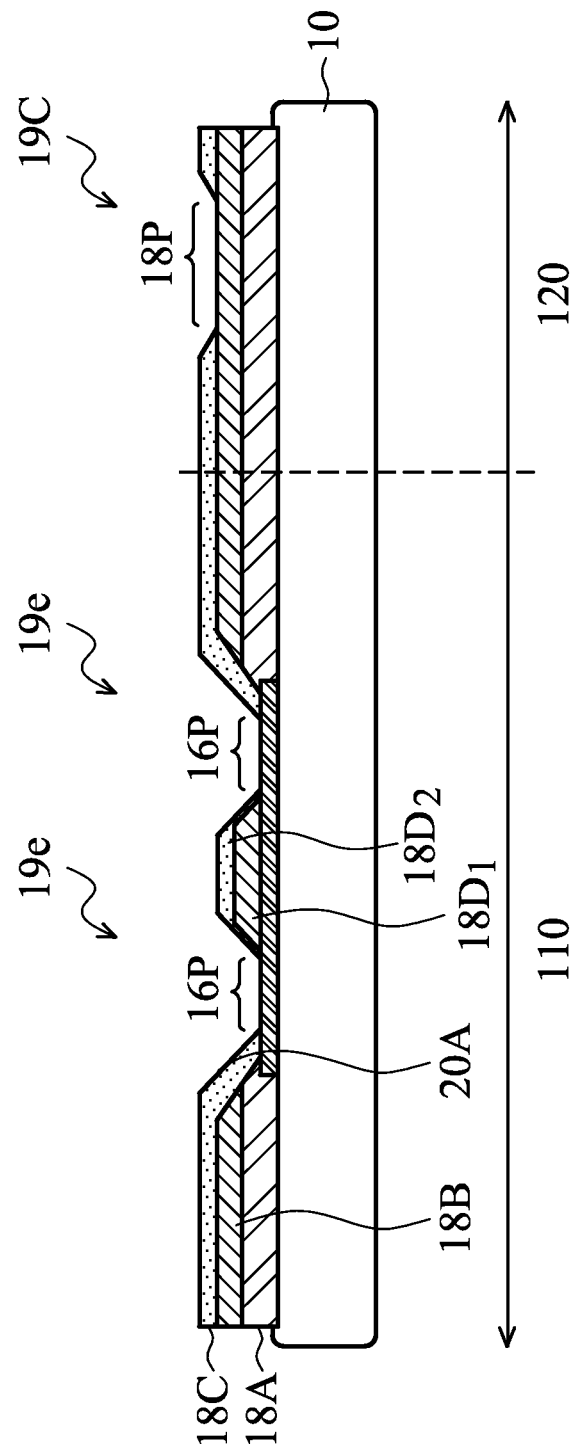
Figure 7C:
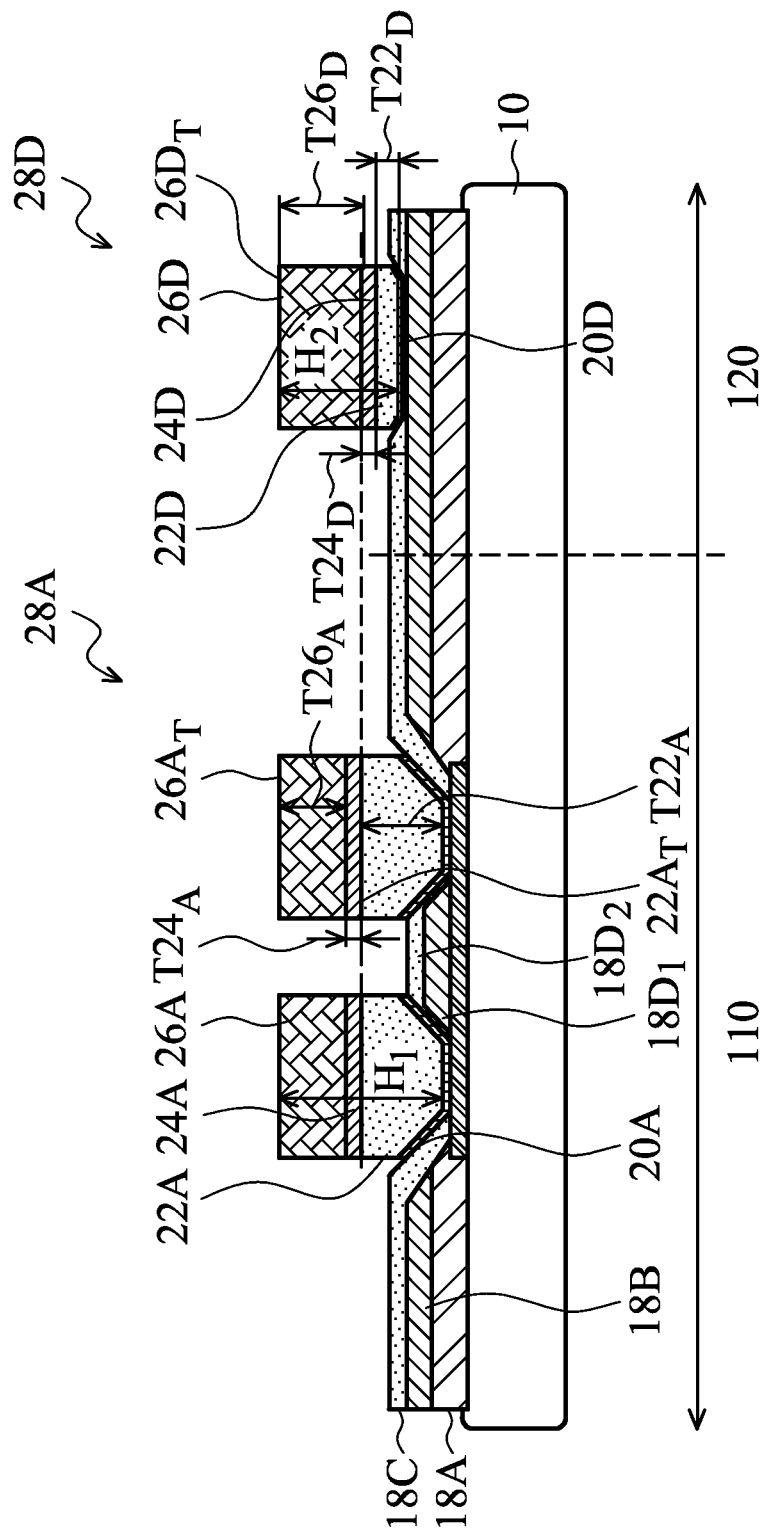

FIGS. 7A through 7C are cross-sectional views of intermediate stages in the manufacturing of bump structures in accordance with an embodiment. Unless specified otherwise, the reference numerals in these embodiments represent like elements in the embodiments illustrated in FIGS. 3A-3D.

Referring to FIG. 7A, the formation of the passivation layer 18 includes forming the dielectric layer 18A and then forming an opening in the dielectric layer 18A such that a portion of the metal pad 16 is exposed. Next, the first polymer layer 18B is formed on the dielectric layer 18A and the exposed portion of the metal pad 16 followed by forming at least two openings 19d in the first polymer layer 18B. The second openings 19d are formed in the first region 110 to expose portions of the metal pad 16. In an embodiment, the first polymer layer 18B remaining on the metal pad 16 forms at least one polymer buffer $18D_1$ which separating the two adjacent openings 19d.

Referring to FIG. 7B, the second polymer layer 18C is formed on the resulted structure shown in FIG. 7A, and then another openings 19e and 19c are formed in the second polymer layer 18C in the first region 110 and the second region 120. In some embodiments, at least two openings 19e are formed within the two openings 19d respectively to expose at least two connection portions 16P of the metal pad 16 within the first region 110. In an embodiment as depicted in FIG. 7B, the second polymer layer 18C includes a portion $18D_2$ remaining on the polymer buffer $18D_1$, which separates the two adjacent openings 19e. In some embodiments, at least one opening 19c is formed in the first region 110 to expose a landing portion 18P of the first polymer layer 18B.

Next, shown in FIG. 7C, the bump structures 28A and 28D are formed on the connection portions 16P and the landing portion 18P respectively. The first bump structures 28A are formed on the connection portions 16P and a second bump structure 28D is formed on the landing portion 18P of the second polymer layer 18C. In an embodiment, the first bump structure 28A includes the first UBM layer 20A, the first metal pillar 22A, the first metal capping layer 24A and the first solder capping layer 26A. In an embodiment, the second bump structure 28D includes the second UBM layer 20D, the second metal pillar 22D, the second metal capping layer 24D and the second solder capping layer 26D. By controlling the thickness of the metal pillars 22A and 22D in different regions 110 and 120, the top surface of the first bump structure 28A is substantially leveled with the top surface of the second bump structures 28D. Since the first bump structure 28A is positioned on the metal pad 16 and the second bump structure 28D is positioned over the layers 18A and 18B, the first bump height $H_1$ is greater than the second bump height $H_2$. In some embodiments, the thicknesses of layers in the bump structures 28A and 28D satisfy the followings. $T_{22A}$ is greater than $T_{22D}$, $T_{24A}$ is substantially equal to $T_{24D}$, and $T_{26A}$ is less than $T_{26D}$. For example, the difference between $T_{22A}$ and $T_{22D}$, is about 1 to about 20 μm. In some embodiments, the top surface $22A_T$ of the first metal pillar 22A is substantially leveled with the top surface $24D_T$ of the second metal capping layer 24D.

Figure 8:
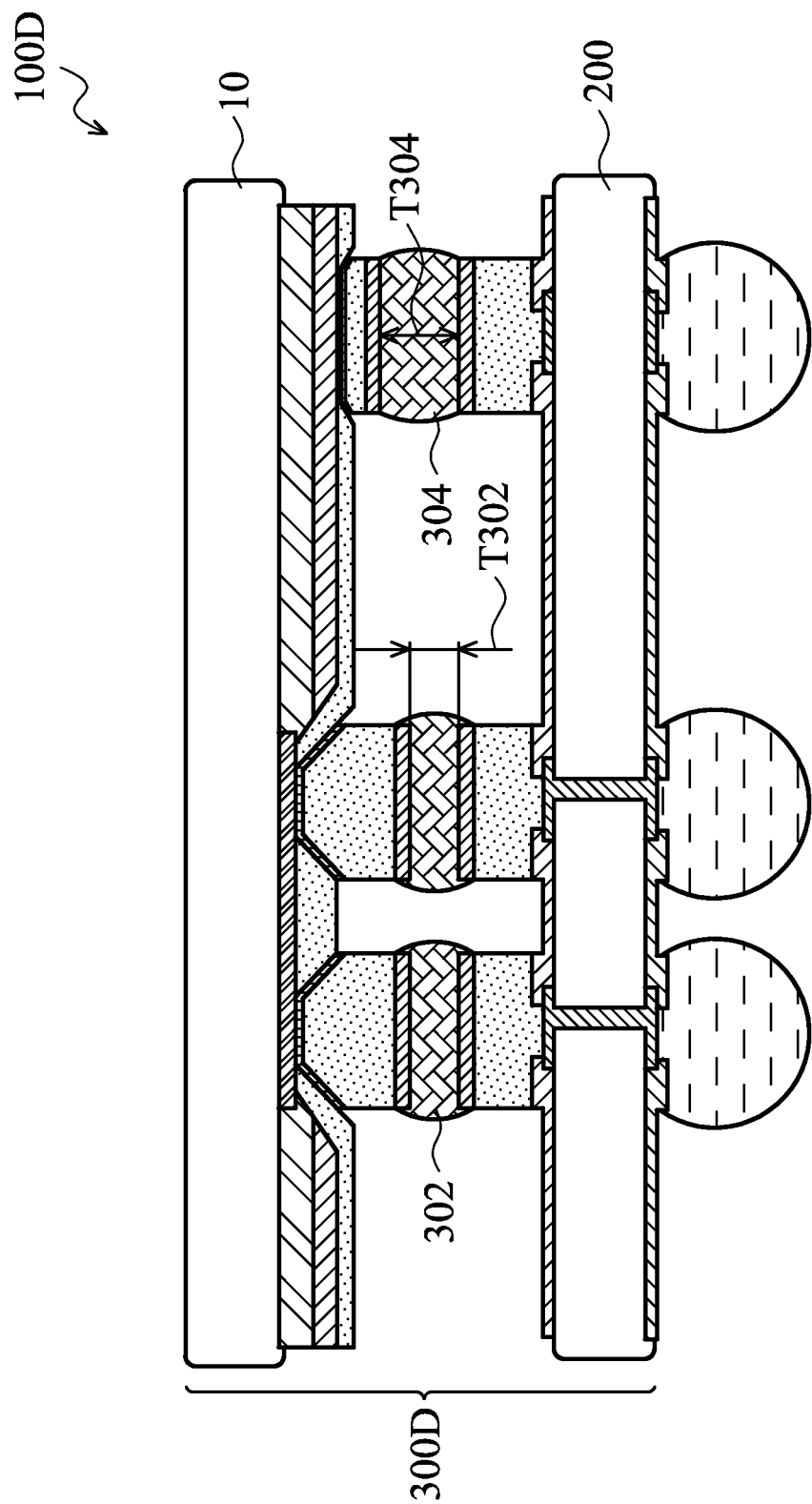
FIG. 8 is a cross-sectional view of a package structure with the semiconductor chip shown in FIG. 7C in accordance with some embodiments.

In some embodiments, the first substrate 10 includes a number of chip regions that are sawed and separated from each other to form individual chips 100D in accordance with some embodiments. FIG. 8 depicts in a cross-sectional view a package structure 300D with the chip 100D bonded to the second substrate 200 in accordance with some embodiments. Unless specified otherwise, the reference numerals in these embodiments represent like elements in the embodiments illustrated in FIG. 4. The package structure 300D shows the chip 100D bonded to the second substrate 200 by connecting the bumps structures 28A and 28D on the first substrate 10 to the connectors 208A and 208B, respectively, on the second substrate 200. In an embodiment, the thickness $T_{304}$ of the second solder joint region 304 is greater than the thickness $T_{302}$ of the first solder joint region 302.

Figure 9A:
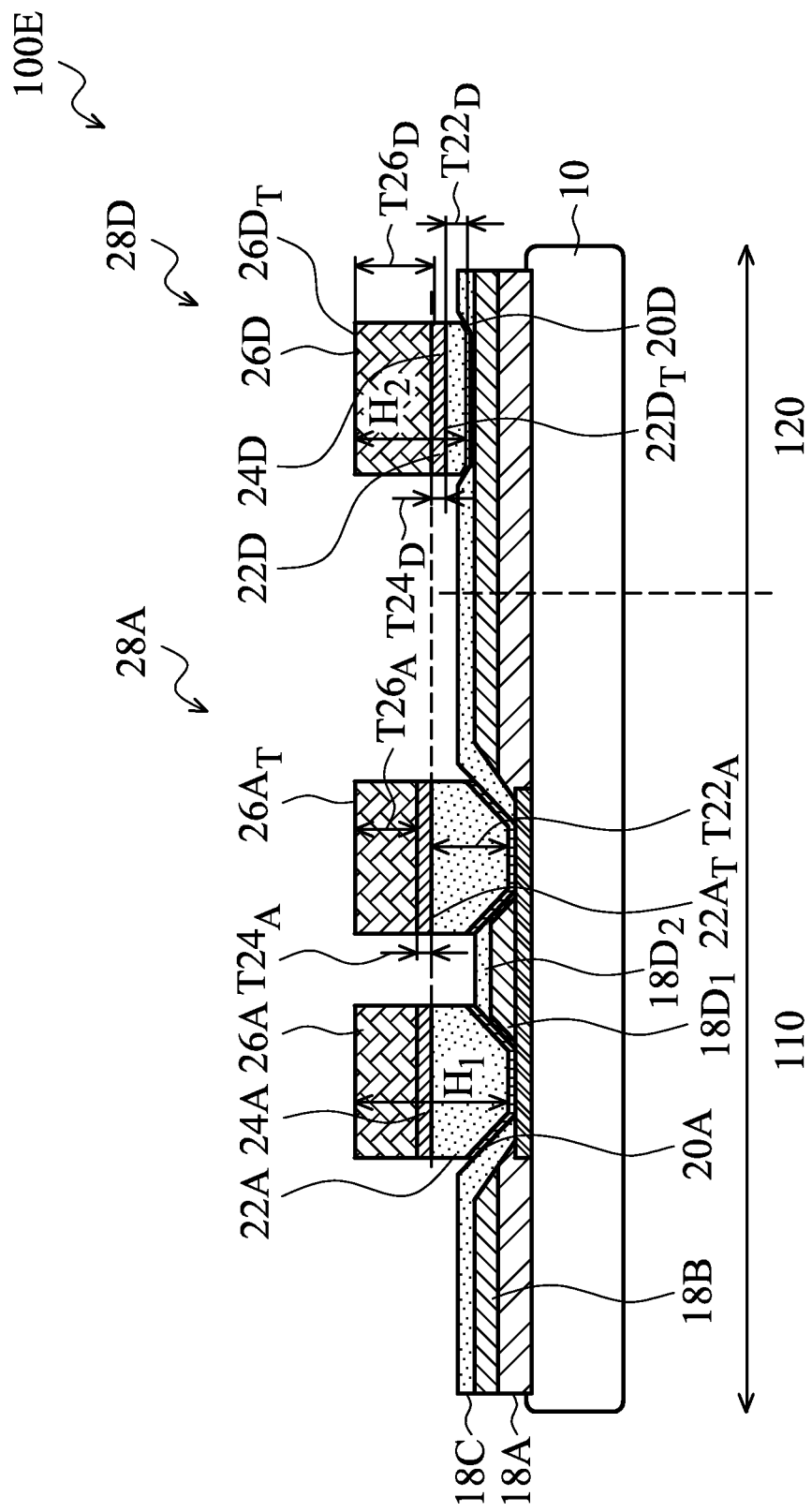
FIG. 9A is a cross-sectional view of bump structures on a semiconductor chip in accordance with some embodiments.
Figure 9B:
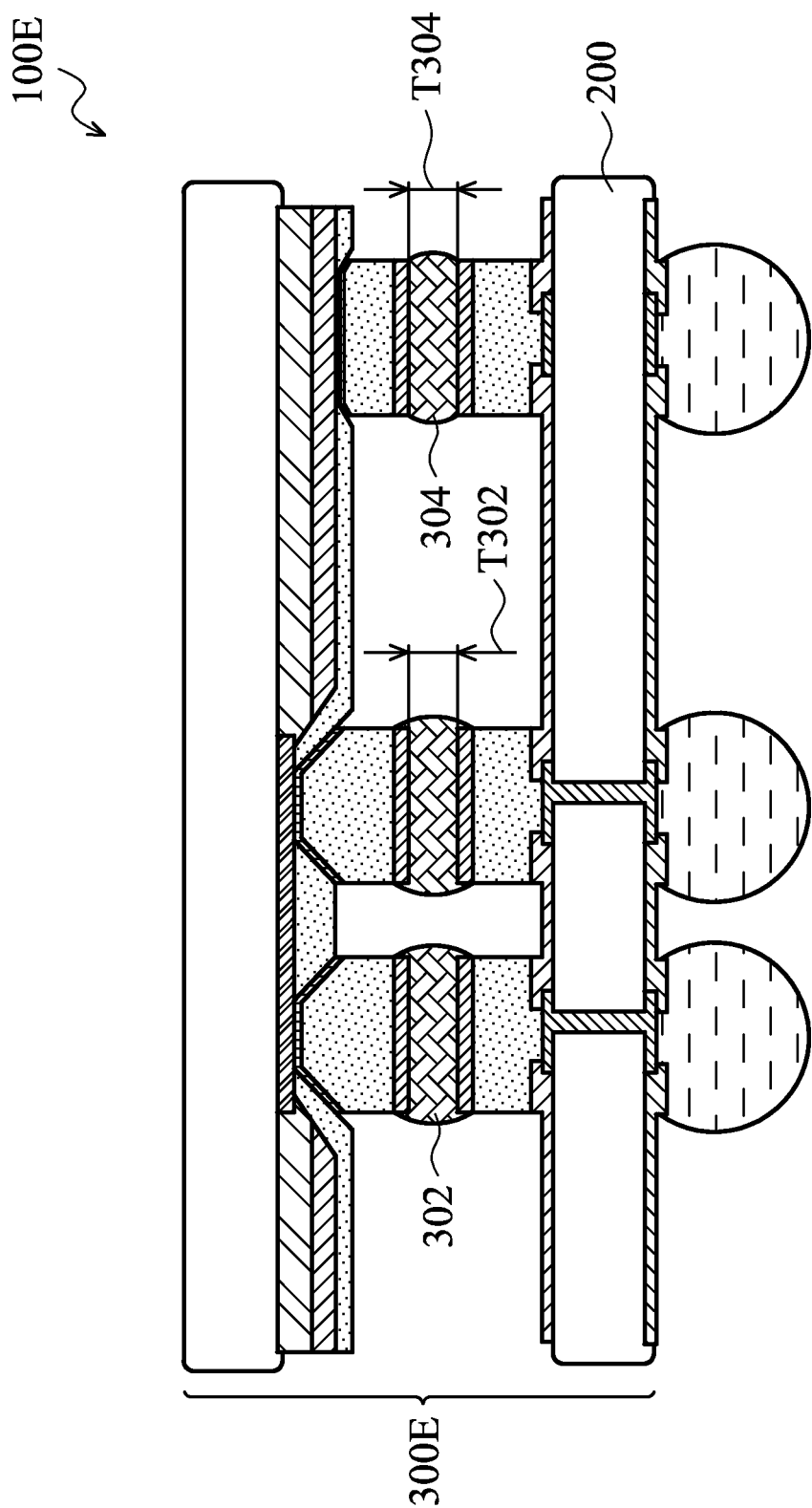
FIG. 9B is a cross-sectional view of a package structure with the semiconductor chip shown in FIG. 9A in accordance with some embodiments.

FIG. 9A is a cross-sectional view of bump structures on a semiconductor chip 100E in accordance with some embodiments, and FIG. 9B is a cross-sectional view of a package structure 300E with the semiconductor chip 100E bonded to the second substrate 200 in accordance with some embodiments. Unless specified otherwise, the reference numerals in these embodiments represent like elements in the embodiments illustrated in FIGS. 7-8.

Referring to FIG. 9A, the top of the first bump structure 28A is substantially leveled with the top of the second bump structures 28D. In an embodiment, the top surface $26A_T$ of the first solder capping layer 26A is substantially leveled with the top surface $26D_T$ of the second solder capping layer 26D. In some embodiments, the bump heights and thicknesses of layers in the bump structures 28A and 28D satisfy the following criteria. $H_1$ is greater than $H_2$, $T_{22A}$ is greater than $T_{22D}$, $T_{24A}$ is substantially equal to $T_{24D}$, and $T_{26A}$ is substantially equal to $T_{26D}$. For example, the difference between $T_{22A}$ and $T_{22D}$, is about 1 to about 20 p.m. In some embodiments, the top surface $22A_T$ of the first metal pillar 22A is substantially leveled with the top surface $22D_T$ of the second metal pillar 22D. Referring to FIG. 9B, in the package structure 300E, the chip 100E is bonded to the second substrate 200 by connecting the bumps structures 28A and 28D on the first substrate 10 to the connectors 208A and 208B, respectively, on the second substrate 200. In an embodiment, the thickness $T_{304}$ of the second solder joint region 304 is substantially equal to the thickness $T_{302}$ of the first solder joint region 302.

Figure 10A:
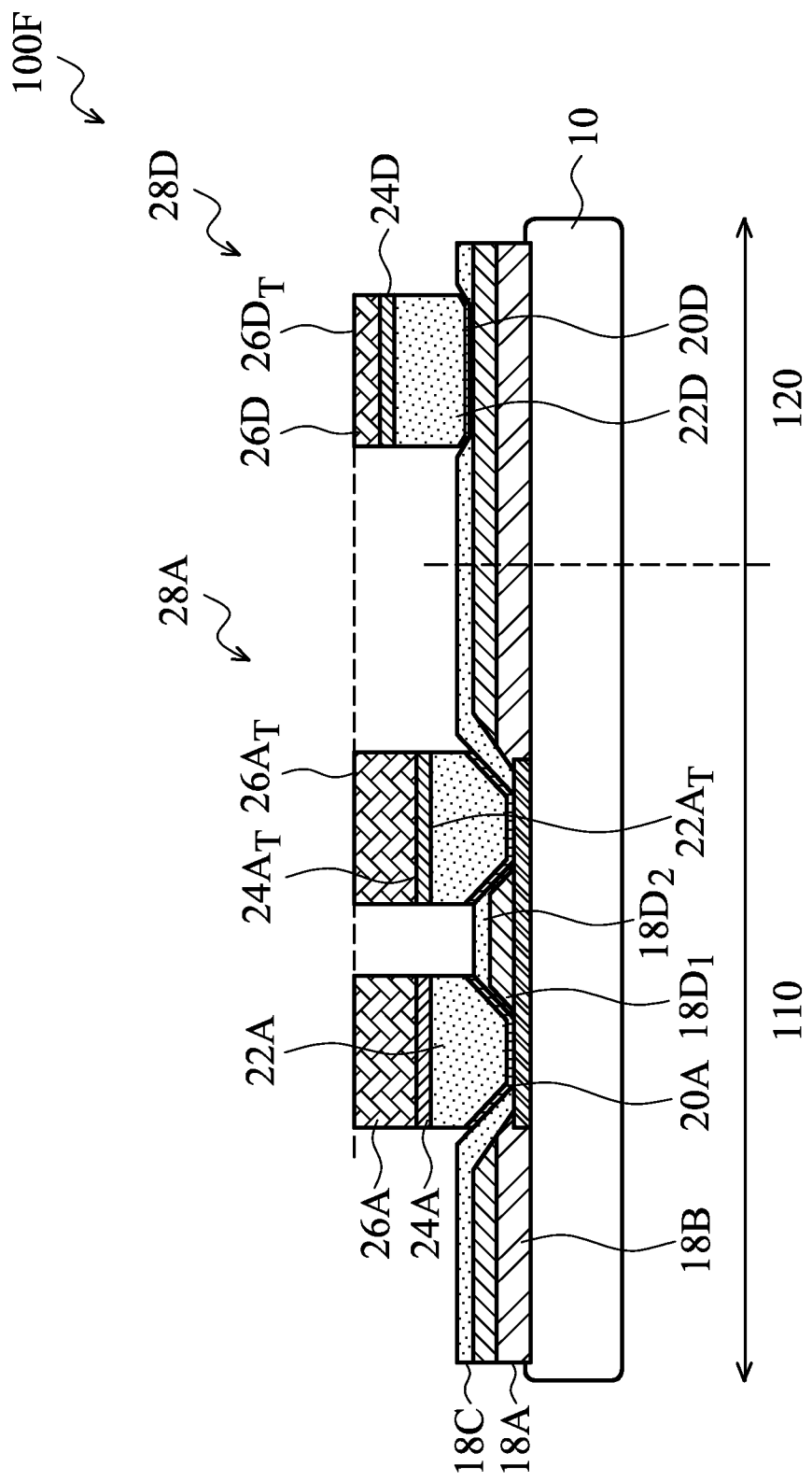
FIG. 10A is a cross-sectional view of bump structures on a semiconductor chip in accordance with some embodiments.
Figure 10B:
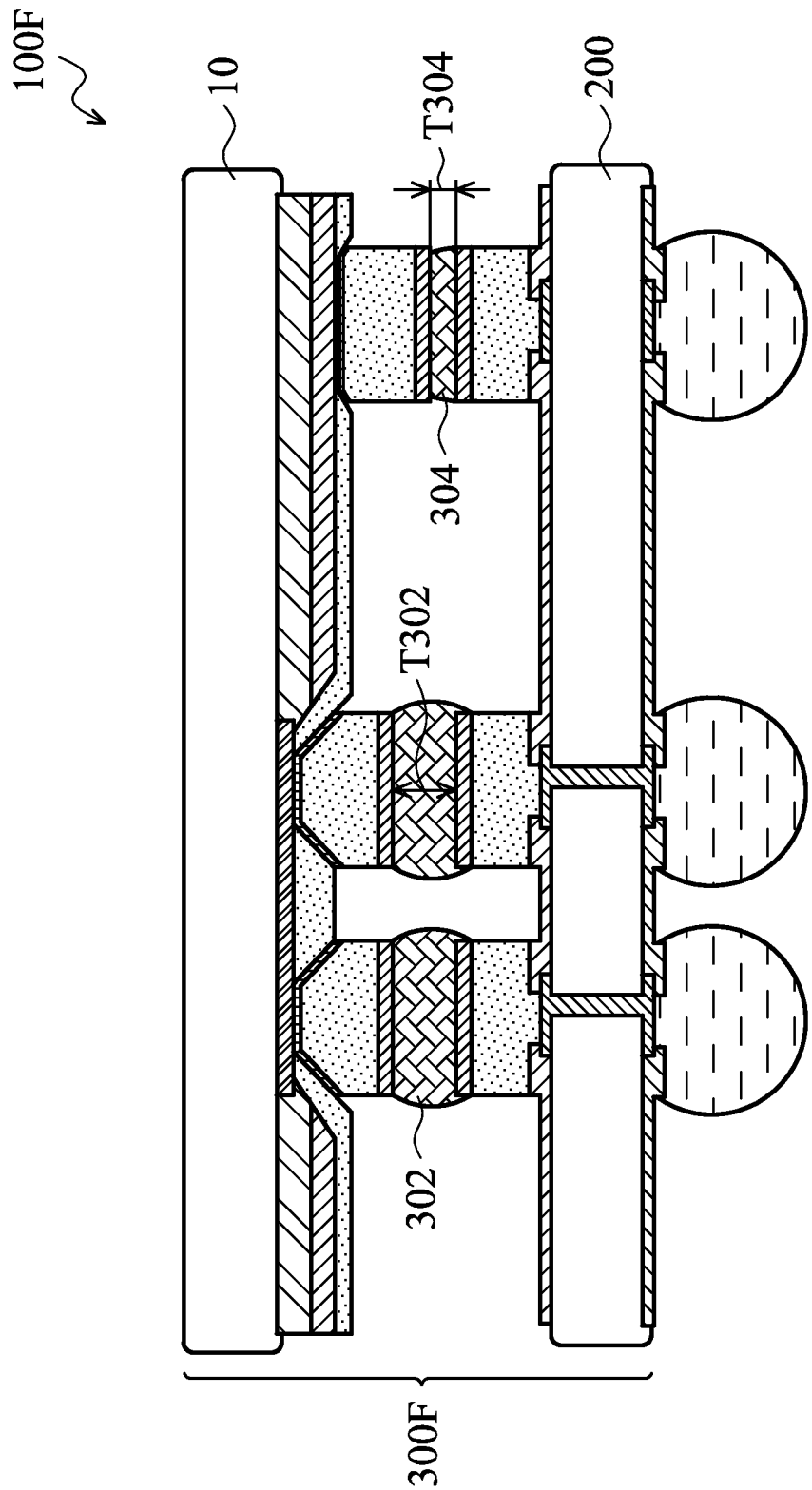
FIG. 10B is a cross-sectional view of a package structure with the semiconductor chip shown in FIG. 10A in accordance with some embodiments.

FIG. 10A is a cross-sectional view of bump structures on a semiconductor chip 100F in accordance with some embodiments, and FIG. 10B is a cross-sectional view of a package structure 300F with the semiconductor chip 100F bonded to the second substrate 200 in accordance with some embodiments. Unless specified otherwise, the reference numerals in these embodiments represent like elements in the embodiments illustrated in FIGS. 7-8.

Referring to FIG. 10A, the top of the first bump structure 28A is substantially leveled with the top of the second bump structures 28D. In an embodiment, the top surface $26A_T$ of the first solder capping layer 26A is substantially leveled with the top surface $26D_T$ of the second solder capping layer 26D. In some embodiments, the bump heights and thicknesses of layers in the bump structures 28A and 28D satisfy the following criteria. $H_1$ is greater than $H_2$, $T_{22A}$ is substantially equal to $T_{22D}$, $T_{24A}$ is substantially equal to $T_{24D}$, and $T_{26A}$ is greater than $T_{26D}$. For example, the ratio of $T_{26A}$ to $T_{26D}$ is at the range from about 1.5 to about 3. For another example, the difference between $T_{26A}$ to $T_{26D}$ is about 1 to about 10 μm. In some embodiments, the top surface $22A_T$ of the first metal pillar 22A is lower than the top surface $22D_T$ of the second metal pillar 22D, and the top surface $24A_T$ of the first metal capping layer 24A is lower than the top surface $24D_T$ of the second metal capping layer 24D. Referring to FIG. 10B, in the package structure 300F, the chip 100F is bonded to the second substrate 200 by connecting the bumps structures 28A and 28D on the first substrate 10 to the connectors 208A and 208B, respectively, on the second substrate 200. In an embodiment, the thickness $T_{302}$ of the first solder joint region 302 is greater than the thickness $T_{304}$ of the second solder joint region 304. For example, the ratio of $T_{304}$ to $T_{302}$ is at the range from about 1.5 to about 3.

Figure 11A:
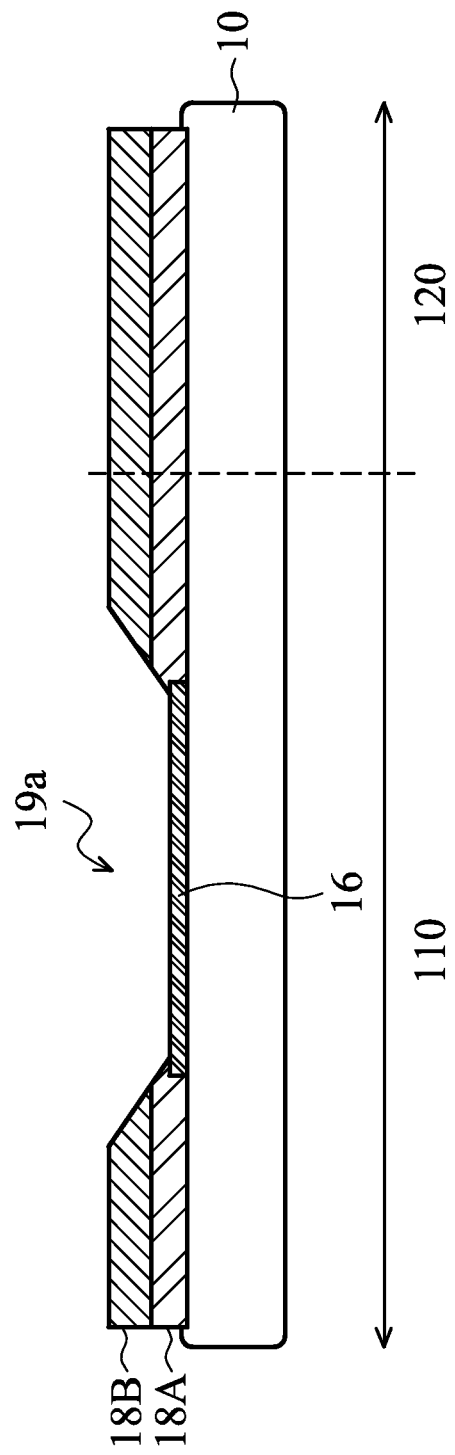
FIGS. 11A through 11B are cross-sectional views of intermediate stages in the manufacturing of bump structures in accordance with an embodiment.
Figure 11B:
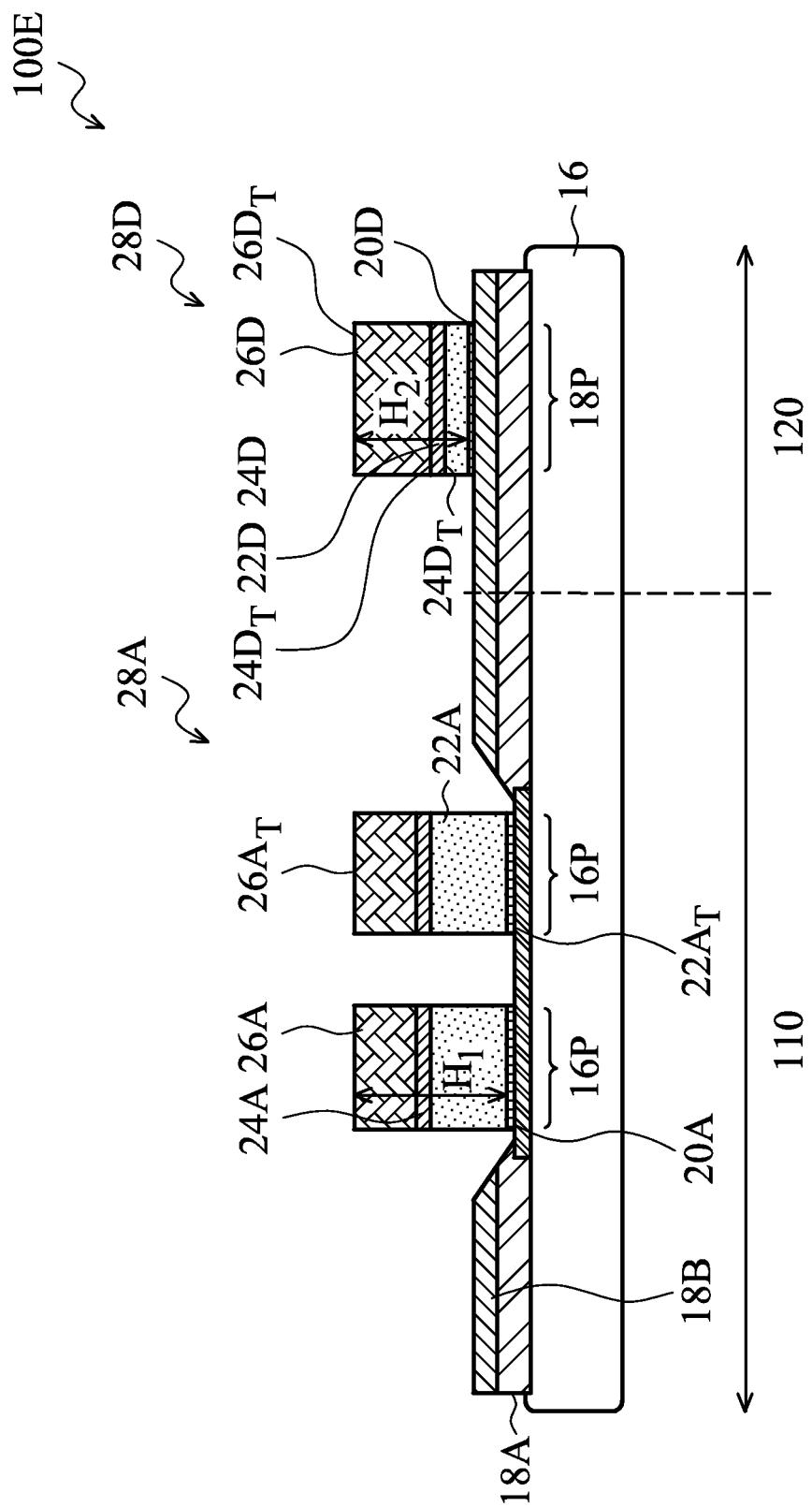

FIGS. 11A through 11B are cross-sectional views of intermediate stages in the manufacturing of bump structures in accordance with an embodiment. Unless specified otherwise, the reference numerals in these embodiments represent like elements in the embodiments illustrated in FIGS. 3A-3D.

Referring to FIG. 11A, the formation of the passivation layer 18 includes forming the dielectric layer 18A and the first polymer layer 18B and then forming an opening 19a passing through the layers 18A and 18B such that a connection portions 16P of the metal pad 16 are exposed. Next, as shown in FIG. 11B, the first bump structures 28A are formed on the connection portions 16P and the second bump structure 28D is formed on a predetermined portion 18P of the first polymer layer 18B. By controlling the thickness of the metal pillars 22A and 22D in different regions 110 and 120, the top of the first bump structure 28A is substantially leveled with the top of the second bump structures 28D. In some embodiments, the bump heights and thicknesses of layers in the bump structures 28A and 28D satisfy the following criteria. $H_1$ is greater than $H_2$, $T_{22A}$ is greater than $T_{22D}$, $T_{24A}$ is substantially equal to $T_{24D}$, and $T_{26A}$ is less than $T_{26D}$. In some embodiments, the top surface $22A_T$ of the first metal pillar 22A is substantially leveled with the top surface $24D_T$ of the second metal capping layer 24D.

Figure 12:
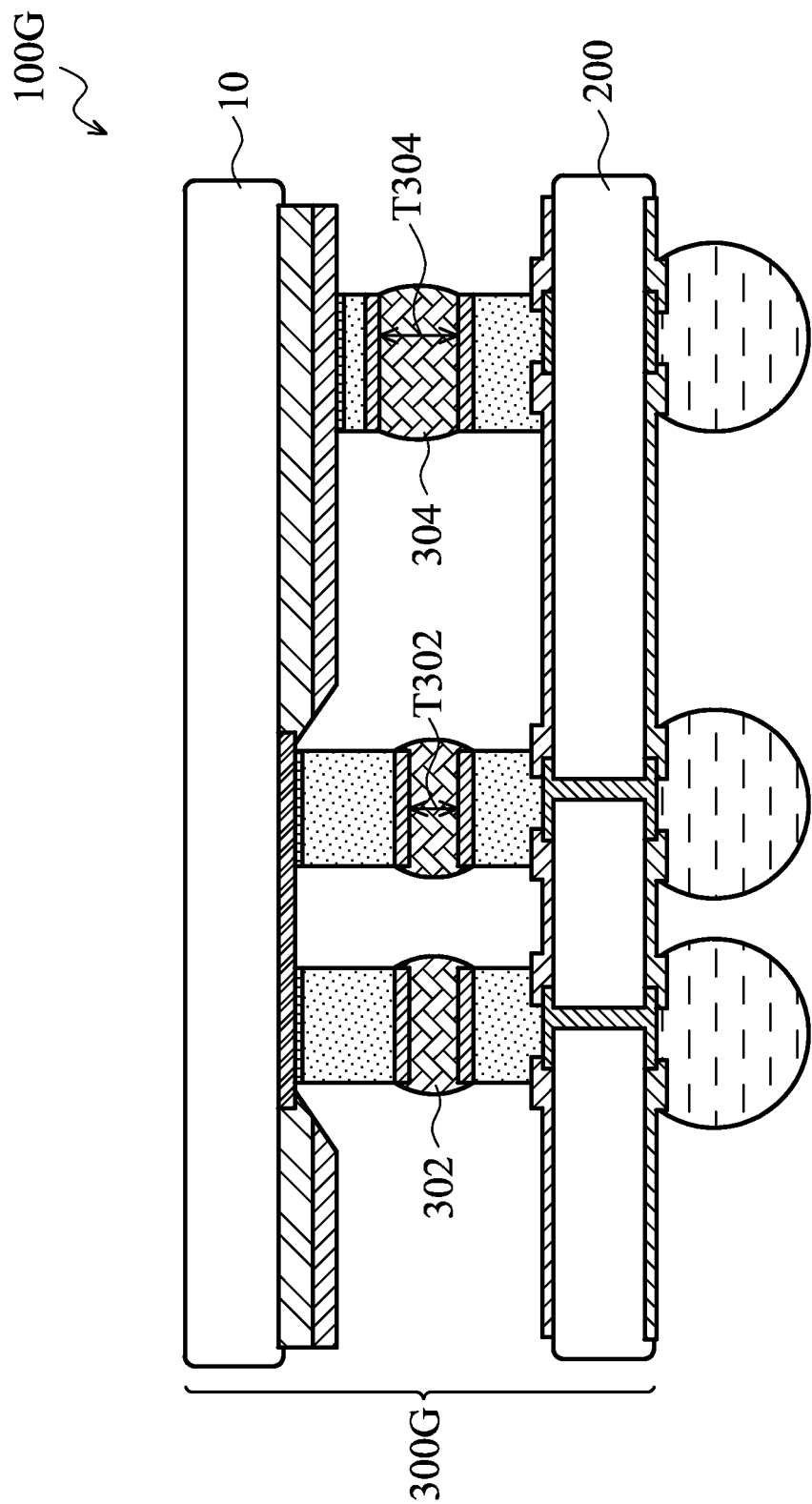
FIG. 12 is a cross-sectional view of a package structure with the semiconductor chip shown in FIG. 11B in accordance with some embodiments.

The first substrate 10 includes a number of chip regions that are sawed and separated from each other to form individual chips 100G in accordance with some embodiments. FIG. 12 depicts in a cross-sectional view of a package structure 300G with the chip 100G bonded to the second substrate 200 in accordance with some embodiments. Unless specified otherwise, the reference numerals in these embodiments represent like elements in the embodiments illustrated in FIG. 4. In the package structure 300G, the chip 100G is bonded to the second substrate 200 by connecting the bumps structures 28A and 28D on the first substrate 10 to the connectors 208A and 208B, respectively, on the second substrate 200. In an embodiment, the thickness $T_{304}$ of the second solder joint region 304 is greater than the thickness $T_{302}$ of the first solder joint region 302.

Figure 13A:
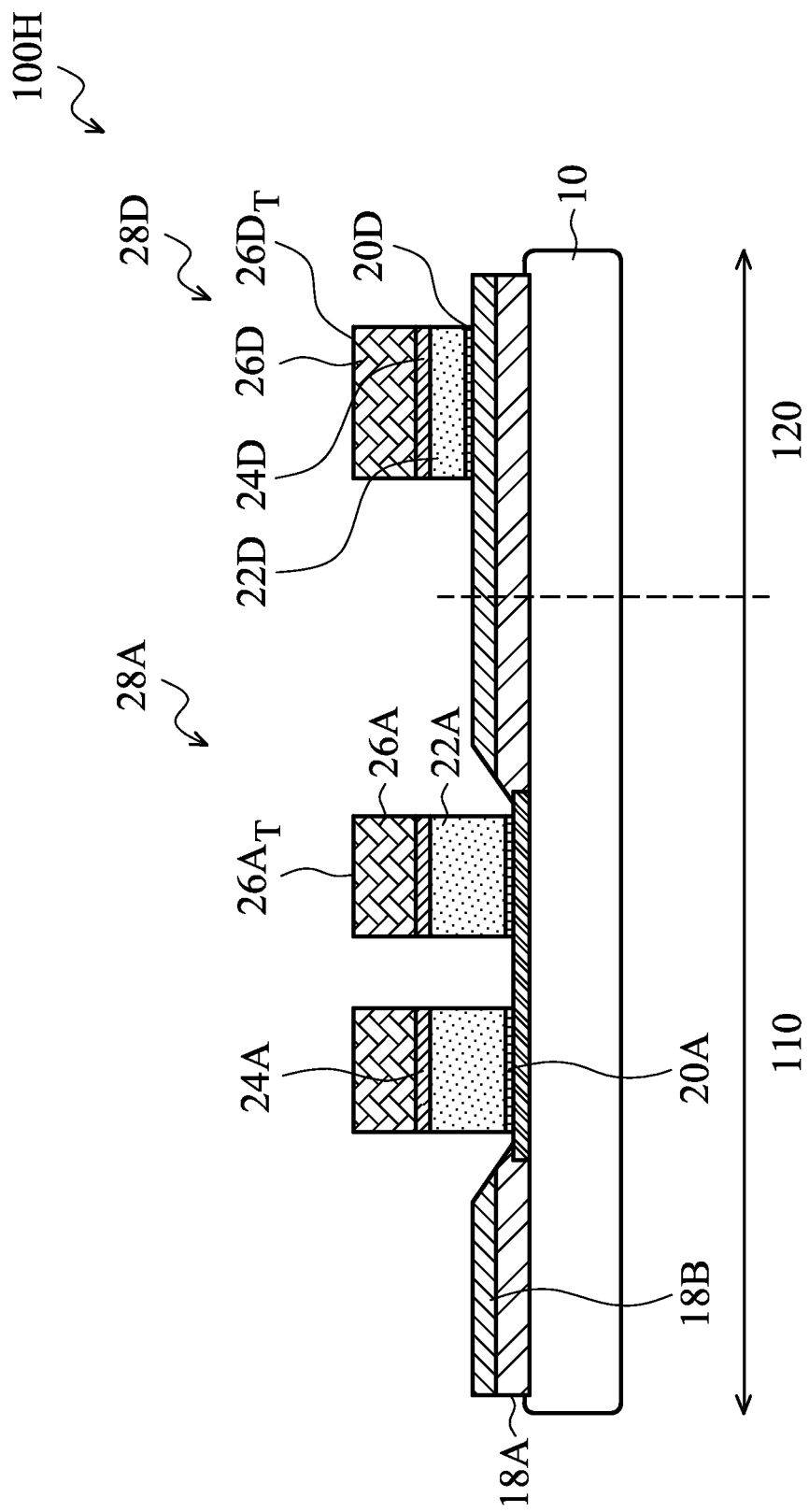
FIG. 13A is a cross-sectional view of bump structures on a semiconductor chip in accordance with some embodiments.
Figure 13B:
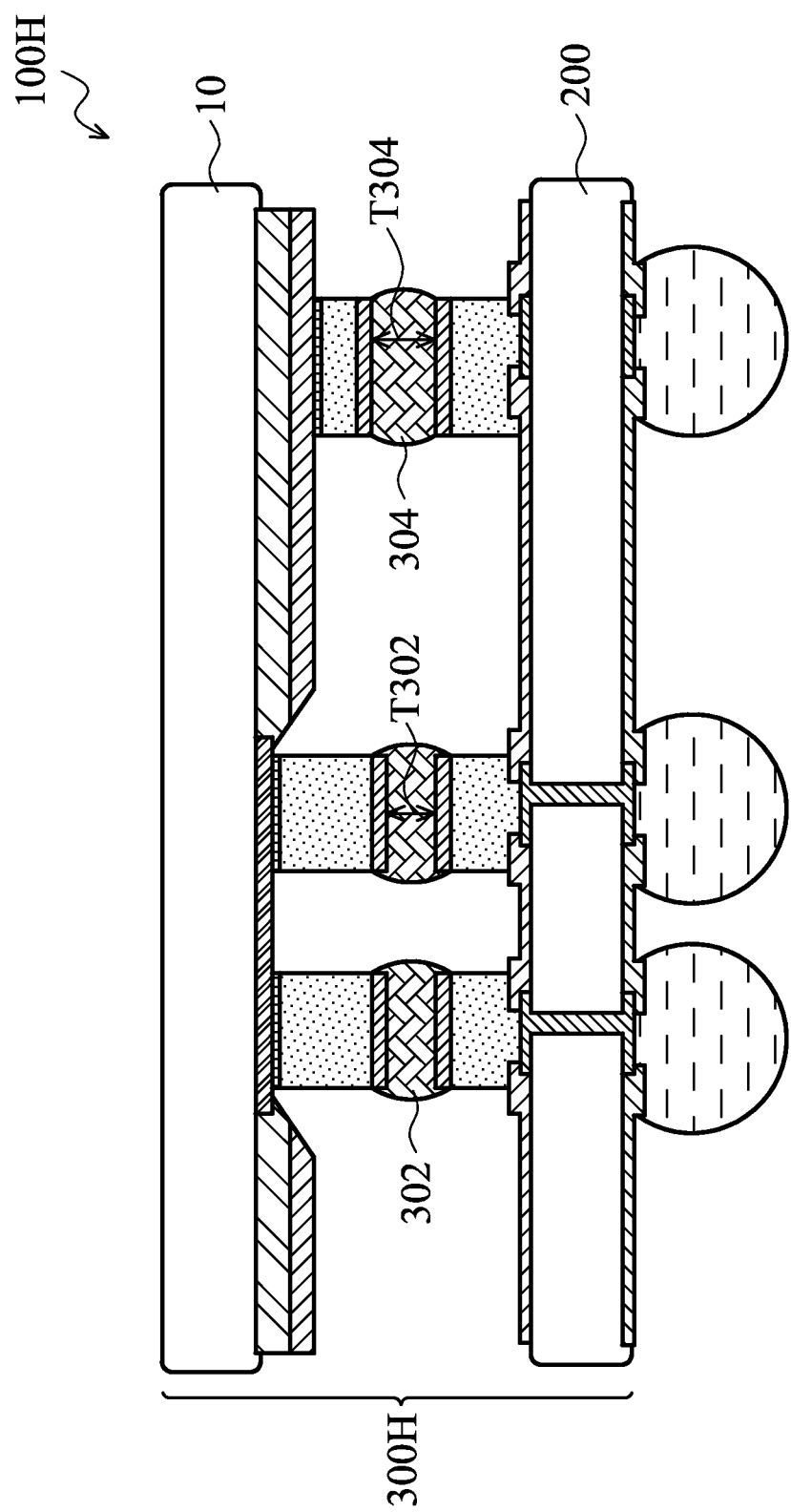
FIG. 13B is a cross-sectional view of a package structure with the semiconductor chip shown in FIG. 13A in accordance with some embodiments.

FIG. 13A is a cross-sectional view of bump structures on a semiconductor chip 100H in accordance with some embodiments, and FIG. 13B is a cross-sectional view of a package structure 300H with the semiconductor chip 100H bonded to the second substrate 200 in accordance with some embodiments. Unless specified otherwise, the reference numerals in these embodiments represent like elements in the embodiments illustrated in FIGS. 11-12.

Referring to FIG. 13A, the top of the first bump structure 28A is substantially leveled with the top of the second bump structures 28D. In an embodiment, the top surface $26A_T$ of the first solder capping layer 26A is substantially leveled with the top surface $26D_T$ of the second solder capping layer 26D. In some embodiments, the bump heights and thicknesses of layers in the bump structures 28A and 28D satisfy the following criteria. $H_1$ is greater than $H_2$, $T_{22A}$ is greater than $T_{22D}$, $T_{24A}$ is substantially equal to $T_{24D}$, and $T_{26A}$ is substantially equal to $T_{26D}$. For example, the difference between $T_{22A}$ and $T_{22D}$, is about 1-20 μm. In some embodiments, the top surface $22A_T$ of the first metal pillar 22A is substantially leveled with the top surface $22D_T$ of the second metal pillar 22D. Referring to FIG. 13B, the package structure 300H shows the chip 100E bonded to the second substrate 200 by connecting the bumps structures 28A and 28D on the first substrate 10 to the connectors 208A and 208B, respectively, on the second substrate 200. In an embodiment, the thickness $T_{304}$ of the second solder joint region 304 is substantially equal to the thickness $T_{302}$ of the first solder joint region 302.

Figure 14A:
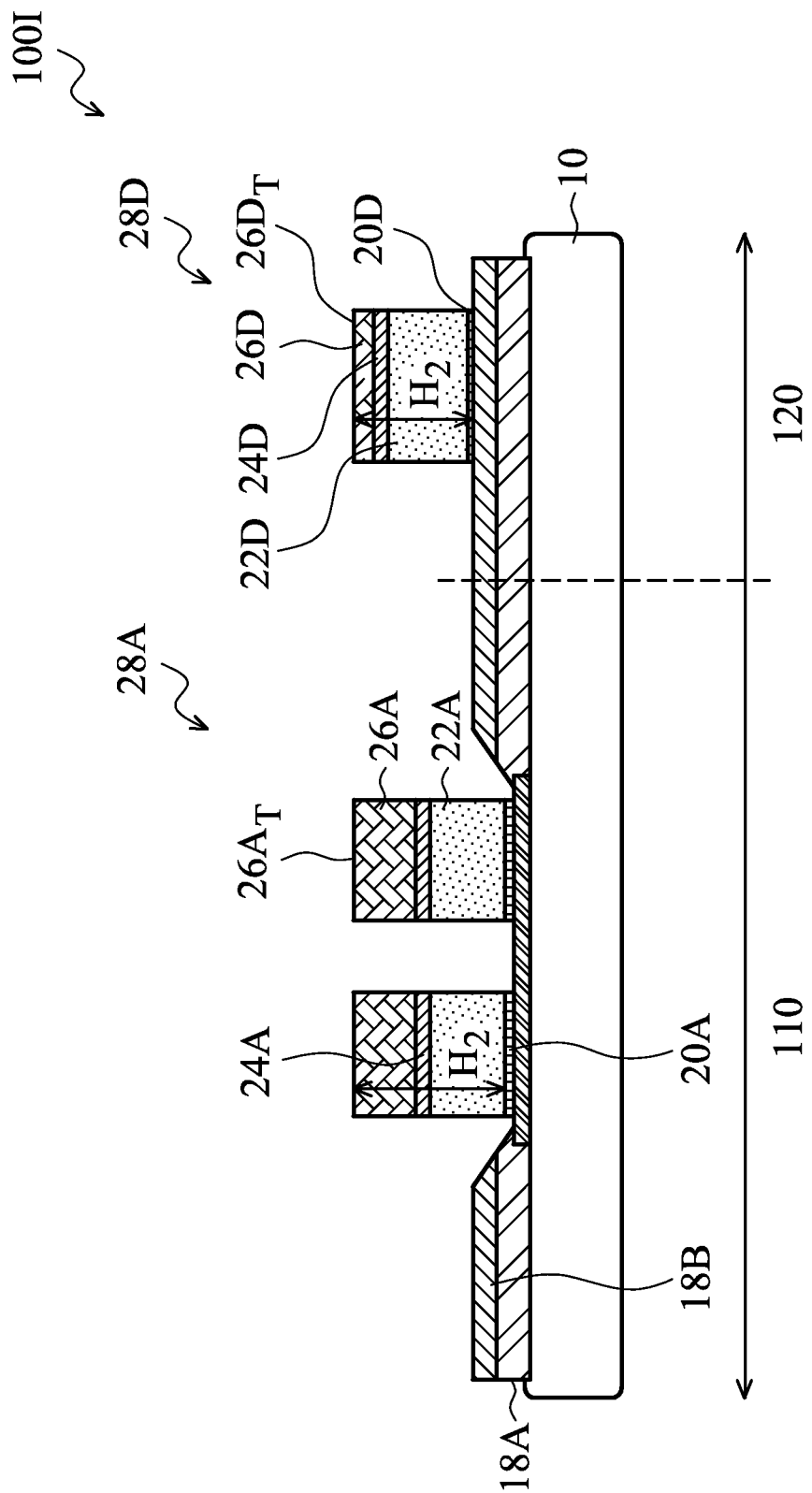
FIG. 14A is a cross-sectional view of bump structures on a semiconductor chip in accordance with some embodiments.
Figure 14B:
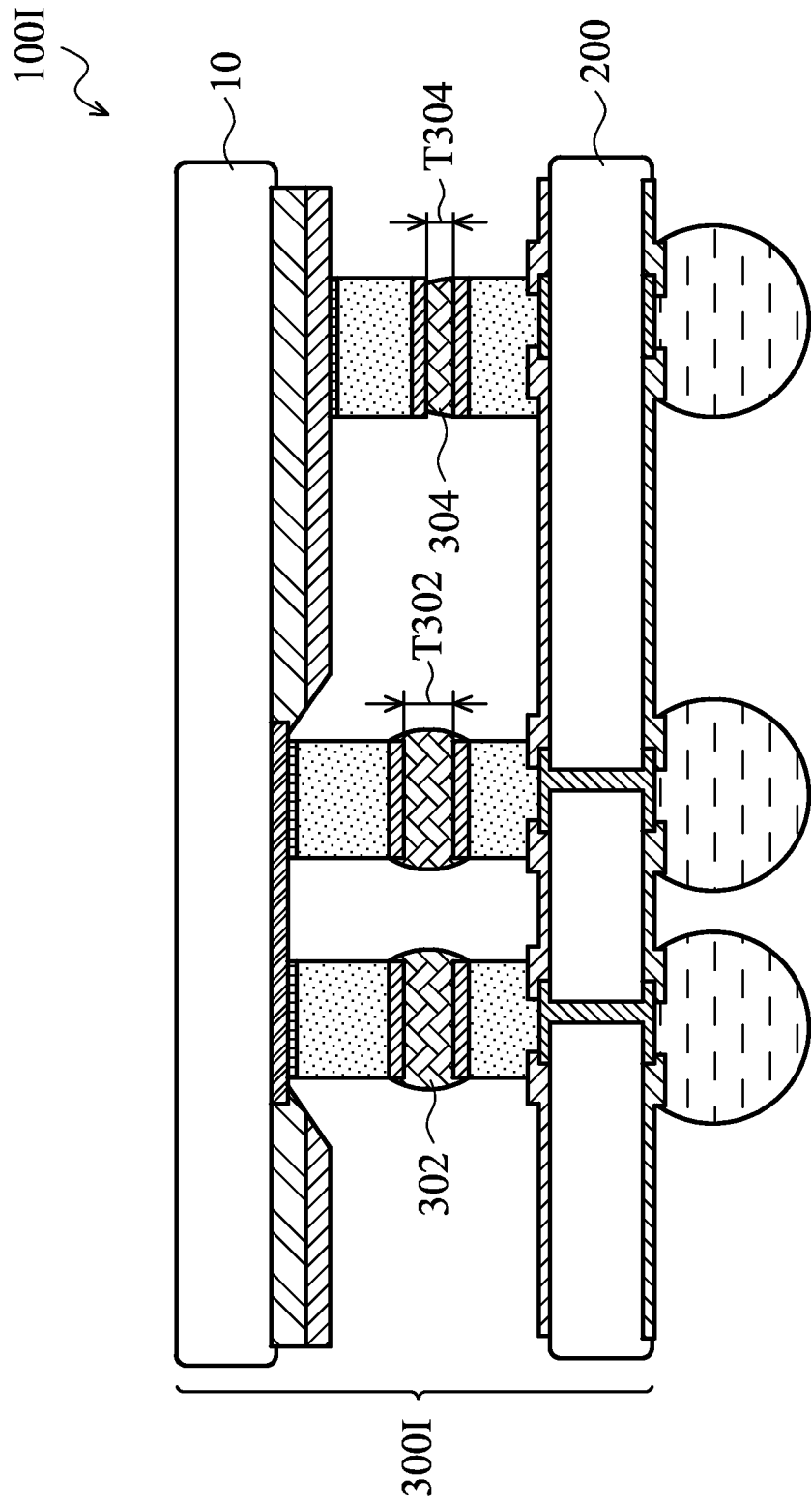
FIG. 14B is a cross-sectional view of a package structure with the semiconductor chip shown in FIG. 14A in accordance with some embodiments.

FIG. 14A is a cross-sectional view of bump structures on a semiconductor chip 1001 in accordance with some embodiments, and FIG. 14B is a cross-sectional view of a package structure 3001 with the semiconductor chip 1001 bonded to the second substrate 200 in accordance with some embodiments. Unless specified otherwise, the reference numerals in these embodiments represent like elements in the embodiments illustrated in FIGS. 11-12.

Referring to FIG. 14A, the top of the first bump structure 28A is substantially leveled with the top of the second bump structures 28D. In an embodiment, the top surface $26A_T$ of the first solder capping layer 26A is substantially leveled with the top surface $26D_T$ of the second solder capping layer 26D. In some embodiments, the bump heights and thicknesses of layers in the bump structures 28A and 28D satisfy the following criteria. $H_1$ is greater than $H_2$ $T_{22A}$ is substantially equal to $T_{22D}$, $T_{24A}$ is substantially equal to $T_{24D}$, and $T_{26A}$ is greater than $T_{26D}$. For example, the ratio of $T_{26A}$ to $T_{26D}$ is at the range from about 1.5 to about 3. For another example, the difference between $T_{26A}$ to $T_{26D}$ is about 1 to about 10 μm. In some embodiments, the top surface $22A_T$ of the first metal pillar 22A is lower than the top surface $22D_T$ of the second metal pillar 22D, and the top surface $24A_T$ of the first metal capping layer 24A is lower than the top surface $24D_T$ of the second metal capping layer 24D. Referring to FIG. 14B, the package structure 3001 shows the chip 1001 bonded to the second substrate 200 by connecting the bumps structures 28A and 28D on the first substrate 10 to the connectors 208A and 208B, respectively, on the second substrate 200. In an embodiment, the thickness $T_{302}$ of the first solder joint region 302 is greater than the thickness $T_{304}$ of the second solder joint region 304. For example, the ratio of $T_{304}$ to $T_{302}$ is at the range from about 1.5 to about 3.

According to some embodiments, a package structure includes a first substrate bonded to a second substrate. The first substrate has a first region and a second region and includes a metal pad overlying the first substrate in the first region, a first metal pillar overlying the metal pad, a passivation layer overlying the first substrate in the second region, and a second metal pillar overlying the passivation layer in the second region. The second substrate includes a first connector and a second connector. The first substrate is bonded to the second substrate, in which a first solder joint region is formed between the first metal pillar and the first connector, and a second solder joint region is formed between the second metal pillar and the second connector. The thickness of the first metal pillar is greater than the thickness of the second metal pillar.

According to some embodiments, a package structure includes a first substrate bonded to a second substrate. The first substrate has a first region and a second region and includes a metal pad overlying the first substrate in the first region, a first metal pillar overlying and electrically connected to the metal pad, a passivation layer overlying the first substrate in the second region, and a second metal pillar overlying the passivation layer in the second region. The second substrate includes a first connector and a second connector. The first substrate is bonded to the second substrate, in which a first solder joint region is formed between the first metal pillar and the first connector, and a second solder joint region is formed between the second metal pillar and the second connector. The thickness of the first solder joint region is greater than the thickness of the second solder joint region.

According to some embodiments, a method of forming bump structures on a first region and a second region of a semiconductor substrate, including: forming a metal pad overlying the first region of semiconductor substrate; forming a passivation layer overlying the metal pad and the semiconductor substrate; patterning the passivation layer to expose a portion of the metal pad; forming an under-bump metallization (UBM) layer on the passivation layer and the exposed portion of the metal pad; forming a first metal pillar on the UBM layer over the exposed portion of the metal pad; and forming a second metal pillar on the UBM layer over the passivation layer within the second region. The thickness of the first metal pillar is greater than or equal to the thickness of the second metal pillar.

While the present disclosure has been particularly shown and described with reference to example embodiments thereof, a skilled person in the art will appreciate that there can be many embodiment variations of this disclosure. Although the embodiments and their features have been described in detail, it should be understood that various changes, substitutions and alterations can be made herein without departing from the spirit and scope of the embodiments.

The above method embodiments show exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A package structure, comprising:
   a first substrate having a first region and a second region and comprising a metal pad overlying the first substrate in the first region, a first metal pillar overlying the metal pad, a passivation layer overlying the first substrate in the second region, and a second metal pillar in the second region, wherein the first metal pillar extends through the passivation layer and has a bottommost surface below a top surface of the passivation layer and the second metal pillar has a bottommost surface on the top surface of the passivation layer; and
   a second substrate comprising a first connector and a second connector,
   wherein the first substrate is bonded to the second substrate, in which a first solder joint region is formed between the first metal pillar and the first connector, and a second solder joint region is formed between the second metal pillar and the second connector; and
   wherein a thickness of the first metal pillar is greater than the thickness of the second metal pillar.

2. The package structure of claim 1, wherein the thickness of the second solder joint region is greater than a thickness of the first solder joint region.

3. The package structure of claim 1, wherein a thickness of the second solder joint region is substantially equal to a thickness of the first solder joint region.

4. The package structure of claim 1, wherein the passivation layer is formed overlying the first substrate in the first region and comprises at least one opening exposing a portion of the metal pad, and the first metal pillar is formed overlying the exposed portion of the metal pad.

5. The package structure of claim 4, wherein the passivation layer comprises at least two openings exposing two portions of the metal pad, and the two openings are separated by a portion of the passivation layer on the metal pad.

6. The package structure of claim 1, further comprising a first metal capping layer between the first metal pillar and the first solder joint region, and a second metal capping layer between the second metal pillar and the second solder joint region.

7. The package structure of claim 1, further comprising a conductive via passing through the second substrate and electrically connected to the first connector.

8. A package structure, comprising:
- a first substrate having a first region and a second region and comprising a metal pad overlying the first substrate in the first region, a first metal pillar overlying and electrically connected to the metal pad, a passivation layer overlying the first substrate in the second region, and a second metal pillar overlying the passivation layer in the second region; and
- a second substrate having a first side and a second side opposite to the first side and comprising a first connector and a second connector on the first side,
- wherein the first substrate is bonded to the first side of the second substrate, in which a first solder joint region is formed between the first metal pillar and the first connector, and a second solder joint region is formed between the second metal pillar and the second connector; and
- wherein the thickness of the first solder joint region is greater than a thickness of the second solder joint region.

9. The package structure of claim 8, wherein a thickness of the first metal pillar is substantially equal to a thickness of the second metal pillar.

10. The package structure of claim 8, wherein the passivation layer is formed overlying the first substrate in the first region and comprises at least one opening exposing a portion of the metal pad, and the first metal pillar is formed overlying the exposed portion of the metal pad.

11. The package structure of claim 10, wherein the passivation layer comprises at least two openings exposing at least two portions of the metal pad, and the at least two openings are separated by a portion of the passivation layer on the metal pad.

12. The package structure of claim 8, further comprising a first metal capping layer between the first metal pillar and the first solder joint region, and a second metal capping layer between the second metal pillar and the second solder joint region.

13. The package structure of claim 8, further comprising a conductive via passing through the second substrate and electrically connected to the first connector.

14. The package structure of claim 8, further comprising a plurality of third connectors on the second side of the second substrate.

* * * * *